United States Patent
Ha et al.

(10) Patent No.: US 7,187,608 B2
(45) Date of Patent: Mar. 6, 2007

(54) SYSTEM AND METHOD FOR CONTROLLING THE ACCESS AND REFRESH OF A MEMORY

(75) Inventors: Min-Yeol Ha, Gyeonggi-do (KR);
Suk-Soo Pyo, Gyeonggi-do (KR);
Hyun-Taek Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 27 days.

(21) Appl. No.: 11/193,805

(22) Filed: Jul. 28, 2005

(65) Prior Publication Data
US 2006/0069855 A1    Mar. 30, 2006

(30) Foreign Application Priority Data
Sep. 25, 2004  (KR) .................... 10-2004-0077594

(51) Int. Cl.
*G11C 7/00*    (2006.01)
*G11C 8/00*    (2006.01)
(52) U.S. Cl. .................... 365/222; 365/194; 365/49
(58) Field of Classification Search ............ 365/222, 365/49, 194
See application file for complete search history.

(56) References Cited

U.S. PATENT DOCUMENTS 6,370,073 B2 *   4/2002  Leung ...................... 365/222
6,615,309 B2 *   9/2003  Tsuchida et al. .......... 711/106
6,697,909 B1     2/2004  Wang et al. ................ 711/106
6,757,784 B2     6/2004  Lu et al. .................... 711/118
6,930,944 B2 *   8/2005  Hush ........................ 365/222
2003/0033492 A1  2/2003  Akiyama et al. ........... 365/49

FOREIGN PATENT DOCUMENTS

KR   2002-0057307    7/2002

OTHER PUBLICATIONS

English language abstract of Korean Publication No. 2002-0057307.

* cited by examiner

*Primary Examiner*—Son T. Dinh
(74) *Attorney, Agent, or Firm*—Marger Johnson & McCollom, P.C.

(57) ABSTRACT

The present invention provides a memory and memory control system wherein, except for one case noted below, the main memory gives priority to read or write operations over refresh operations. On the other hand, the cache memory give priority to the refresh operations over read or write operations. The exceptional case is when a memory read signal is received when the cache refresh is enabled and the data in the cache memory is valid. In this exceptional case, the refresh of the cache memory is delayed. During certain read operations the data in the particular memory block is also written to the cache and no write back from the cache is performed. This reduces the number of write back operations and it eliminates a delay due to the refresh operation.

20 Claims, 15 Drawing Sheets

CONTROL SIGNAL GENERATOR OF THE CACHE MEMORY

CONTROL SIGNAL GENERATOR
OF THE MEMORY BLOCK

SYSTEM AND METHOD FOR CONTROLLING THE ACCESS AND REFRESH OF A MEMORY

RELATED APPLICATION

This application claims priority to Korean application 10-2004-0077594 filed Sep. 25, 2004. The entire content of Korean application 10-2004-0077594 is hereby incorporated herein by reference.

FIELD OF THE INVENTION

The present invention relates to memory systems and more particularly to control circuitry for memory systems.

BACKGROUND

Dynamic Random Access (DRAM) memory is a widely used type of memory. An important characteristic of DRAM memories is that data stored in a DRAM must be periodically refreshed, if not the data will be lost.

External access requests for data generally come at random times. Thus, an external access and a refresh access request can possibly be initiated at the same time. In some memory systems, access to a DRAM is postponed while a refresh operation is taking place. Such systems have variable latencies, thereby increasing the complexity of the system and consuming increased memory bandwidth. In other systems, the cycle timing is designed so that both an external access and a refresh can occur within the allowable cycle time. This prevents the refresh operation from interfering with an external access request.

The time required to access data stored in a memory is termed the access time of the memory. It is well known, that a high speed, static random access memory (SRAM) cache can be added to a memory system in order to decrease average access time. Recently used data is stored in the high speed cache so that many times, a read request can be satisfied without accessing the slower speed main memory. The cache hit rate is a measure of the percentage of times that desired data is in the cache thereby avoiding the necessity of accessing the main memory to fulfill an access request. The actual access time for a memory system is dependent upon the cache hit rate.

The present invention is directed to a method and system for accessing a DRAM memory where the refresh cycle does not generally delay access to the memory.

SUMMARY OF THE PRESENT INVENTION

The present invention provides a memory and memory control system wherein, except for one case noted below, the main memory gives priority to read or write operations over refresh operations. On the other hand, the cache memory give priority to the refresh operations over read or write operations. The exceptional case is when a memory read signal is received when the cache refresh is enabled and the data in the cache memory is valid. In this exceptional case, the refresh of the cache memory is delayed. During a refresh operation, if a read request is to a particular memory block that is not in the cache, and the data in the cache is not valid, during the read operation the data in the particular memory block is also written to the cache. The particular memory block is refreshed after the read operation is complete. In this case no write back from the cache is performed. This reduces the number of write back operations and it eliminates a delay due to the refresh operation.

BRIEF DESCRIPTION OF THE FIGURES

FIGS. 2A-1 and 2A-2 illustrated actions that take place during a read operation.

FIGS. 2B-1 and 2B-2 illustrated actions that take place during a wrute operation.

DETAILED DESCRIPTION

Figure 1:
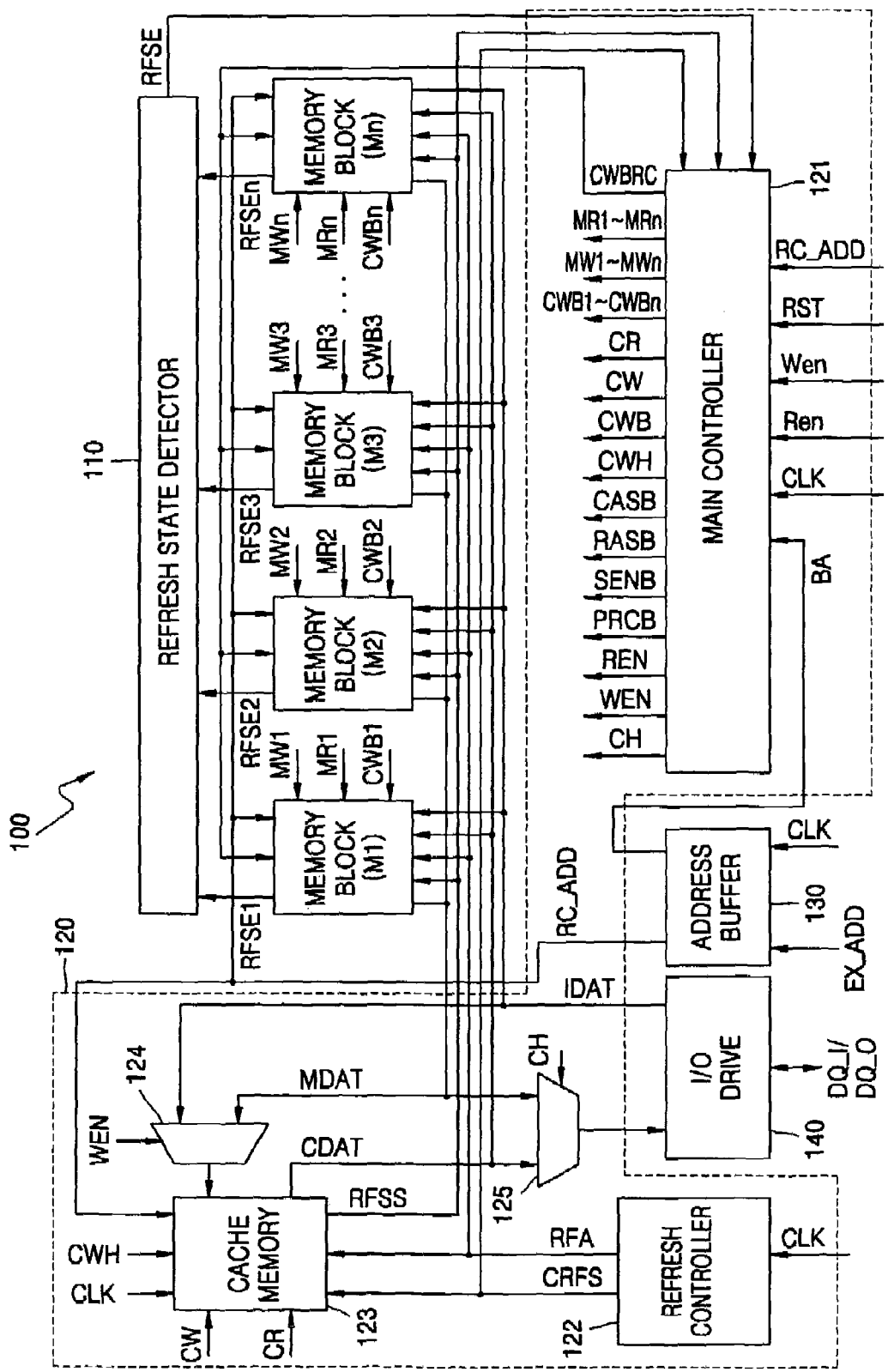
FIG. 1 is a block diagram of a preferred embodiment of the invention.

A preferred embodiment of the present invention is described and discussed below with reference to the drawings listed above. However, it should be understood that various other embodiments of the invention are possible. This invention may be embodied in many different forms and the invention should not be construed as being limited to the embodiments set forth herein.

The drawings illustrate a preferred embodiment of the invention and illustrate the operation of the illustrated embodiment. In the drawings, the size of the boxes is not intended to represent the size of the various physical components. The same reference numerals are used to denote the same elements throughout the drawings.

Only the parts of the various units that are relevant to an explanation of the present invention are shown and described herein. It should be understood that the units shown in the drawings and described herein have other conventional parts in addition to those shown and described. Many conventional parts of the embodiments, and many conventional operations performed by the embodiments, are not shown or described herein in that such parts and operations are known to those skilled in the art. However, the description given below conveys, in full, clear, and concise terms, to one skilled in the art, how to make and use the invention.

In the following description the symbol~is used to mean "to". For example, signals RFSE1~RFSEn means signals RFSE1 to RFSEn. The term "target memory block" is used herein with reference to read and write operations. The target block of a write operation is the memory block to which data is written. The target block of a read operation is the memory block from which data is read.

FIG. 1 is an overall block diagram of a first preferred embodiment of the invention. Four blocks of DRAM memory, M1, M2, M3 and Mn are shown in FIG. 1. It should, however, be understood that the memory may have any number of such memory blocks as is conventional.

The other units shown in FIG. 1 are the Refresh State Detector 110, the controller unit 120 (shown by the dotted line box), the Address Buffer 130, and the I/O Driver 140. The controller unit 120 (shown in detail in FIGS. 3, 4, 5, and 6) includes the Main Controller 121, the Refresh Controller 122, the Cache Memory 123 (shown in detail in FIG. 7), and the multiplexers 124 and 125.

Figure 3:
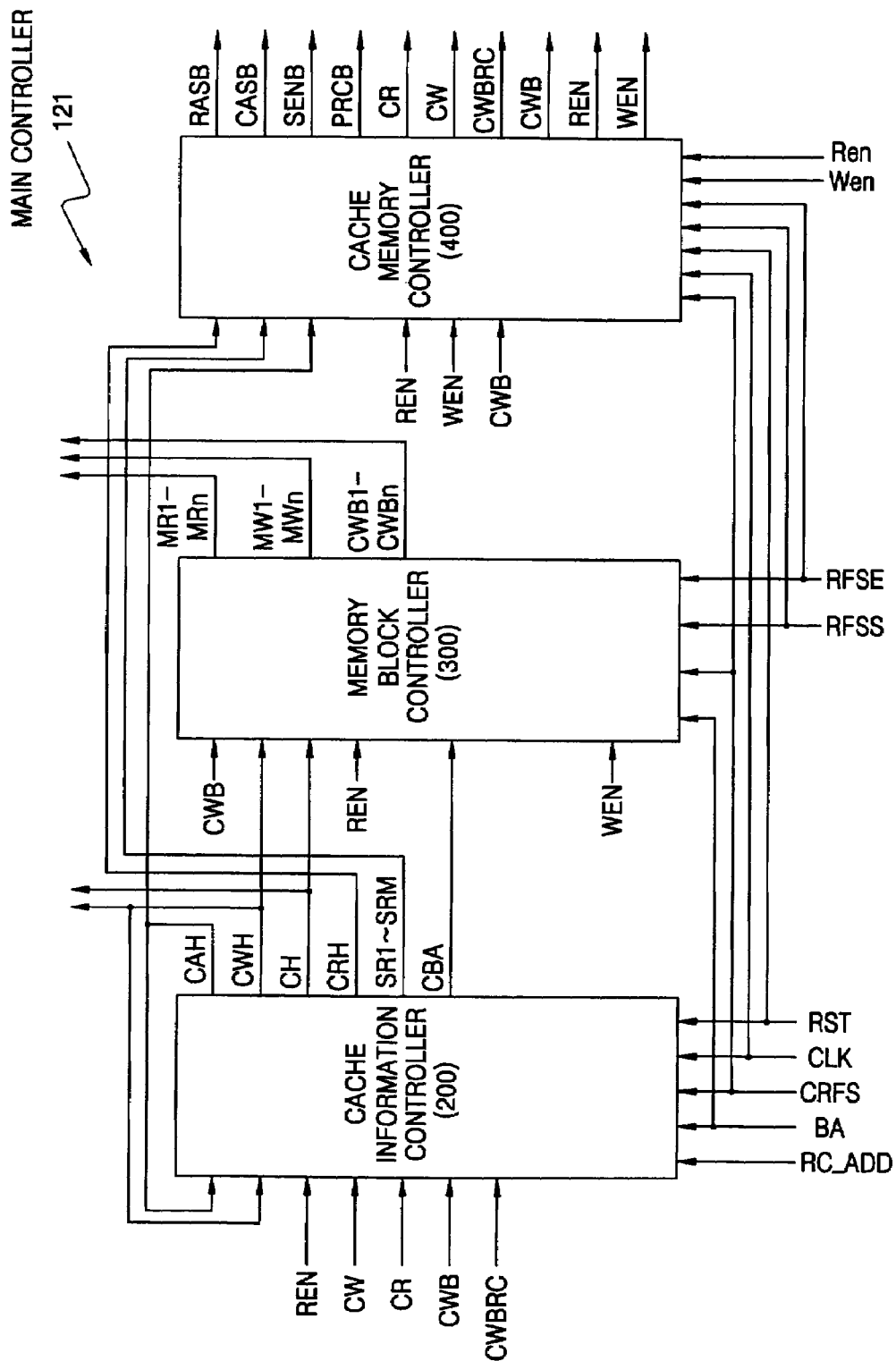
FIG. 3 is an overall block diagram of the main memory controller.
Figure 7:
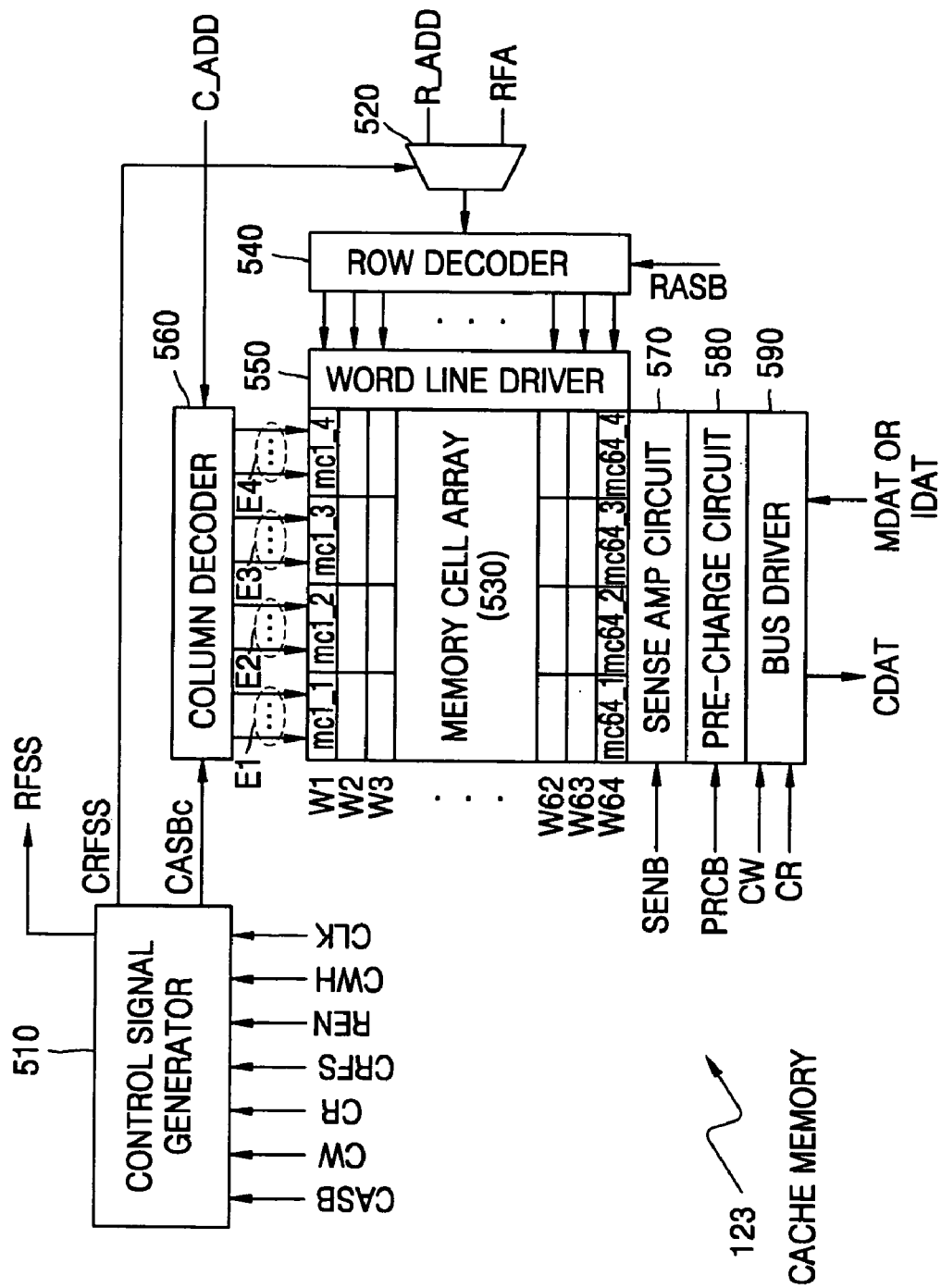
FIG. 7 is a block diagram of the cache memory.
Figure 9:
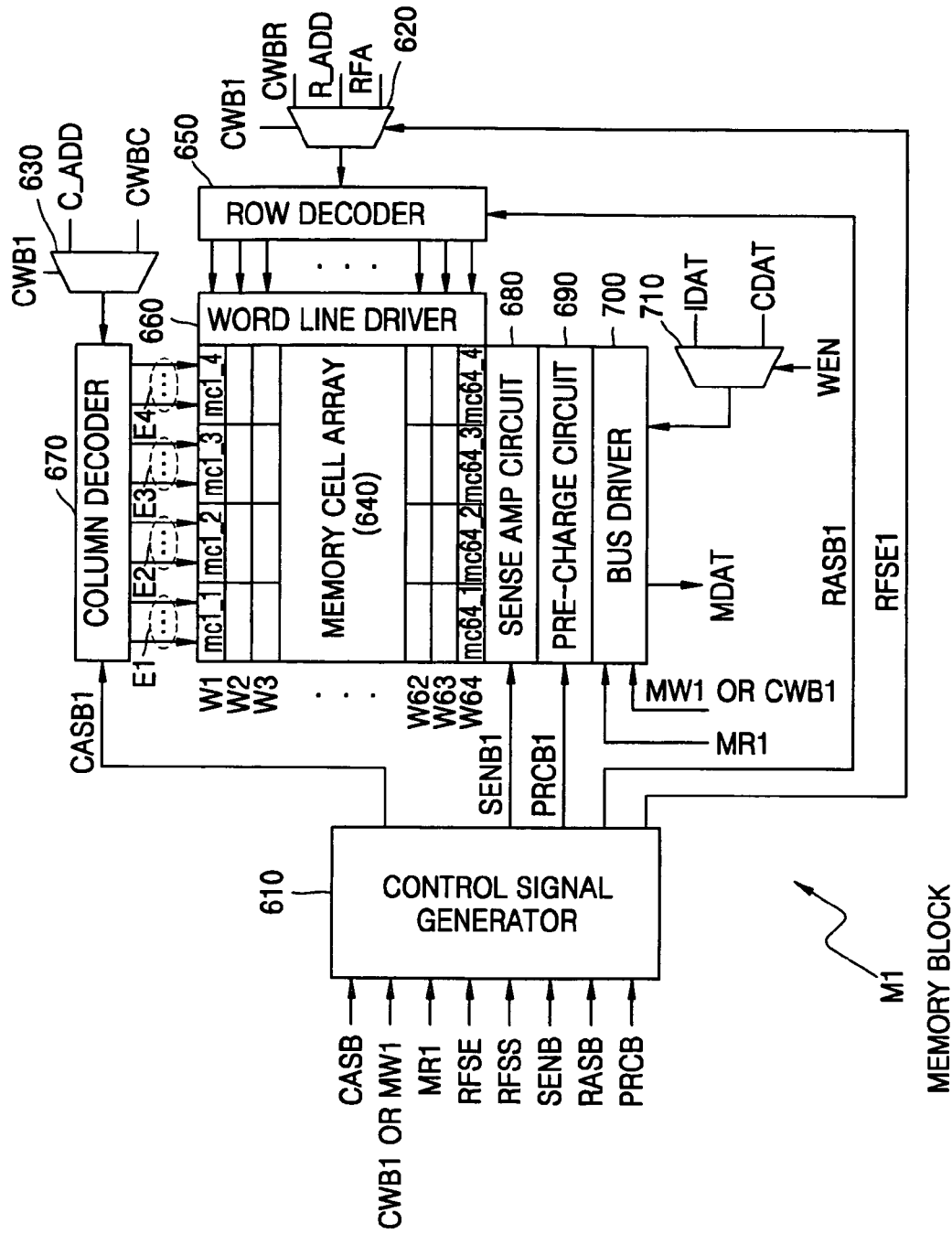
FIG. 9 is a block diagram of a memory block.

The memory blocks M1, M2, M3 and Mn are shown in detail in FIG. 9. FIG. 3 is a block diagram of the Main Controller 121. FIG. 7 is a block diagram of Cache Memory 123.

The memory blocks M1~Mn are refreshed in response to a refresh start signal RFSS and a refresh address signal RFA. The memory blocks output the refresh state signals RFSE1~RFSEn. The memory blocks do a read operation in response to memory read control signals MR1~MRn. The memory blocks do a write operation in response to memory write control signals MW1~MWn and in response to memory re-write control signals CWB1~CWBn.

The Refresh State Detector 110 is a logical circuit that outputs a refresh information signal RFSE in response to any refresh state signal RFSE1~RFSEn. The Refresh State Detector 110 also enables the refresh information signal RFSE when all the refresh state signals RFSE1~RFSEn are enabled.

The Main Controller 121 receives a number of inputs including either a read signal Ren or a write signal Wen. The Main Controller 121 generates a memory control signals including re-write address CWBRC, memory read control signals MR1~MRn, memory write control signals MW1~MWn, memory re-write control signals CWB1~CWBn, cache read control signal CR, cache write control signal CW, cache re-write control signal CWB, cache write hit signal CWH, cache memory hit signals CH, read control signal REN, and write control signal WEN.

Refresh Controller 122 periodically generates refresh control signal CRFS and refresh address signal RFA in response to the clock signal CLK. The exact timing of these signals depends on the physical characteristics of the memory and it is a matter of conventional engineering.

The Cache Memory 123 (shown in detail in FIG. 7) refreshes in response to the refresh control signal CRFS and the refresh address signal RFA and it generates the refresh start signal RFSS. The Cache Memory 123 outputs cache read data CDAT when a cache read control signal CR is enabled. The Cache Memory 123 writes input data IDAT or memory read data MDAT (which is read from the memory block) when the cache write control signal CW is enabled.

Multiplexer 124 outputs the input data IDAT when the write control signal WEN is enabled and it outputs the memory read data MDAT when the control signal WEN is disabled.

Multiplexer 125 outputs the cache read data CDAT when the cache memory hit signal CH is enabled and it outputs the memory read data MDAT when the cache memory hit signal CH is disabled.

Address Buffer 130 receives an external address signal EX_ADD and the clock signal CLK. Address Buffer 130 outputs the bank address signal BA to the main controller 121 and a row/column address signal RC_ADD to the controller 120. The row/column address signal RC_ADD also goes to the cache memory 123 and the memory blocks (M1~Mn).

Figures 1, 2A:
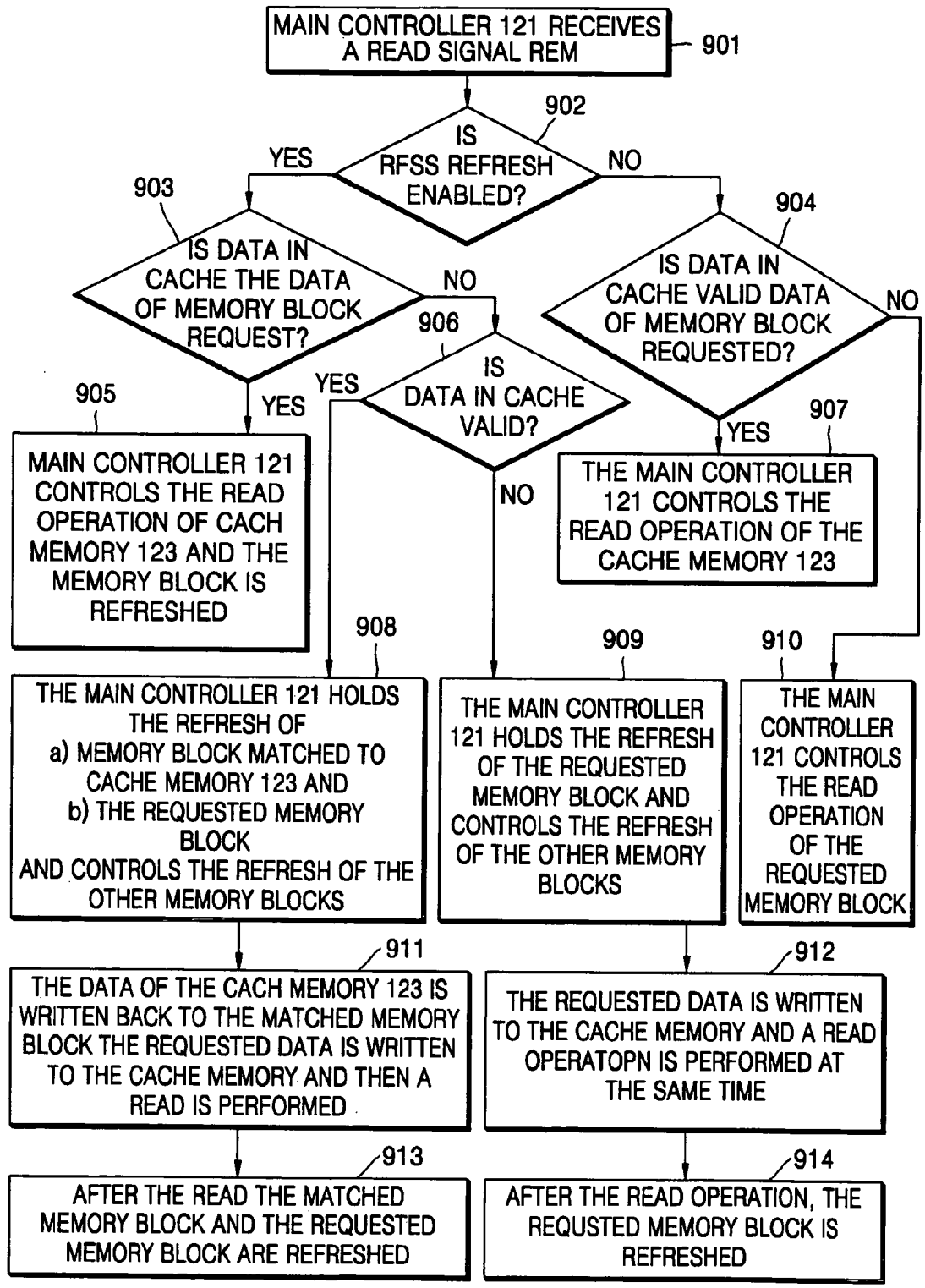
Figures 2, 2A:
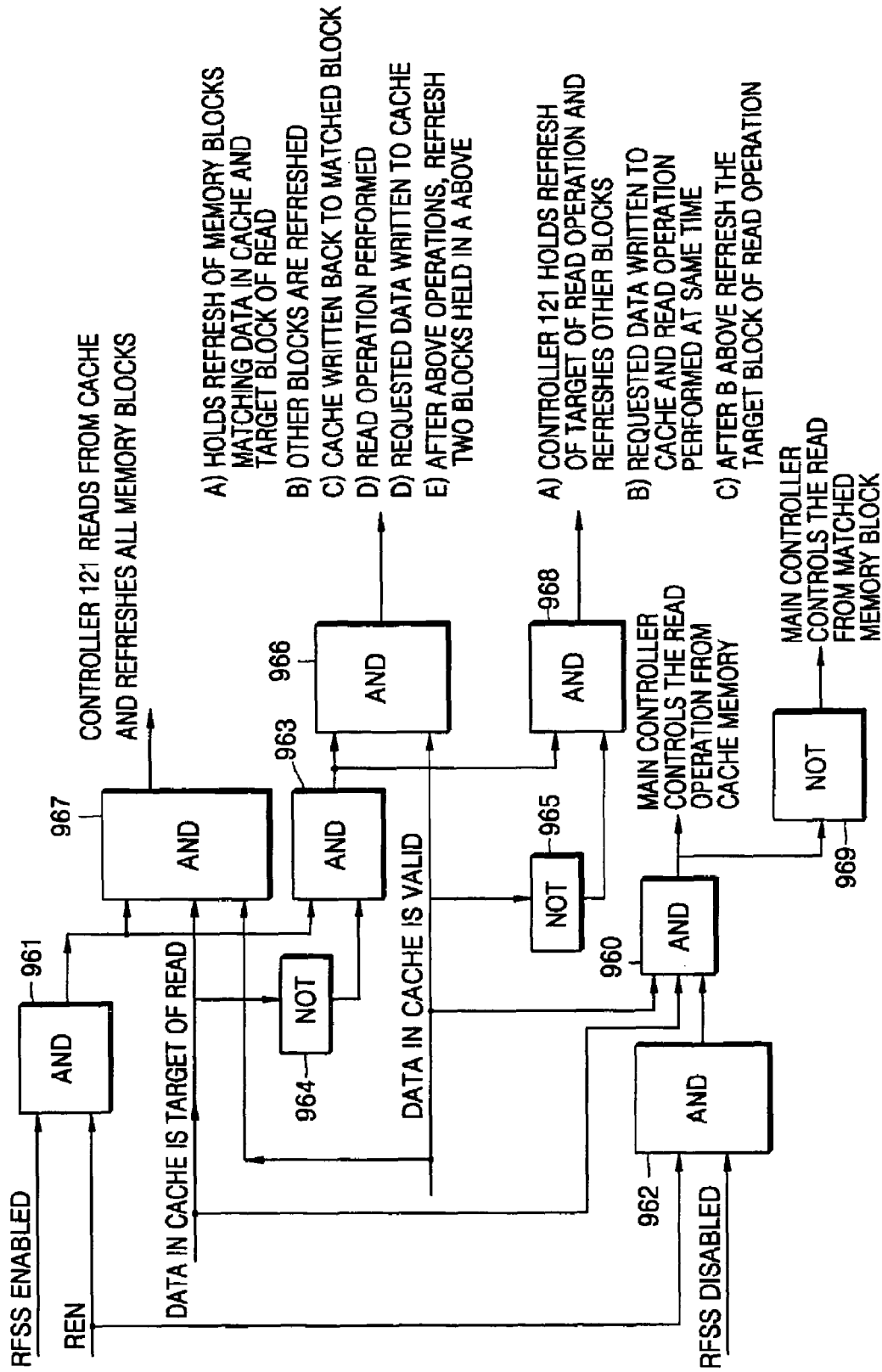

Block flow diagrams in FIG. 2A-1 to FIG. 2F-1 and in FIG. 2A-2 to FIG. 2F-2 explain operations that the system performs in various situations. The diagrams 2A-1 to 2F-2 illustrate certain important actions that occur in the system and the conditions under which these actions occur.

FIG. 2A-1 and FIG. 2A-2 both show what occurs when the RFSS refresh signal is enabled and the main controlled 121 receives a read signal Ren. FIG. 2A also shows what occurs when the RFSS refresh signal is disabled and the main controlled 121 receives a read signal Ren. FIG. 2A-1 is in the form of a flow diagram and FIG. 2A-2 is a logical block diagram. Both Figures shown the same thing in different ways.

Figures 1, 2B:
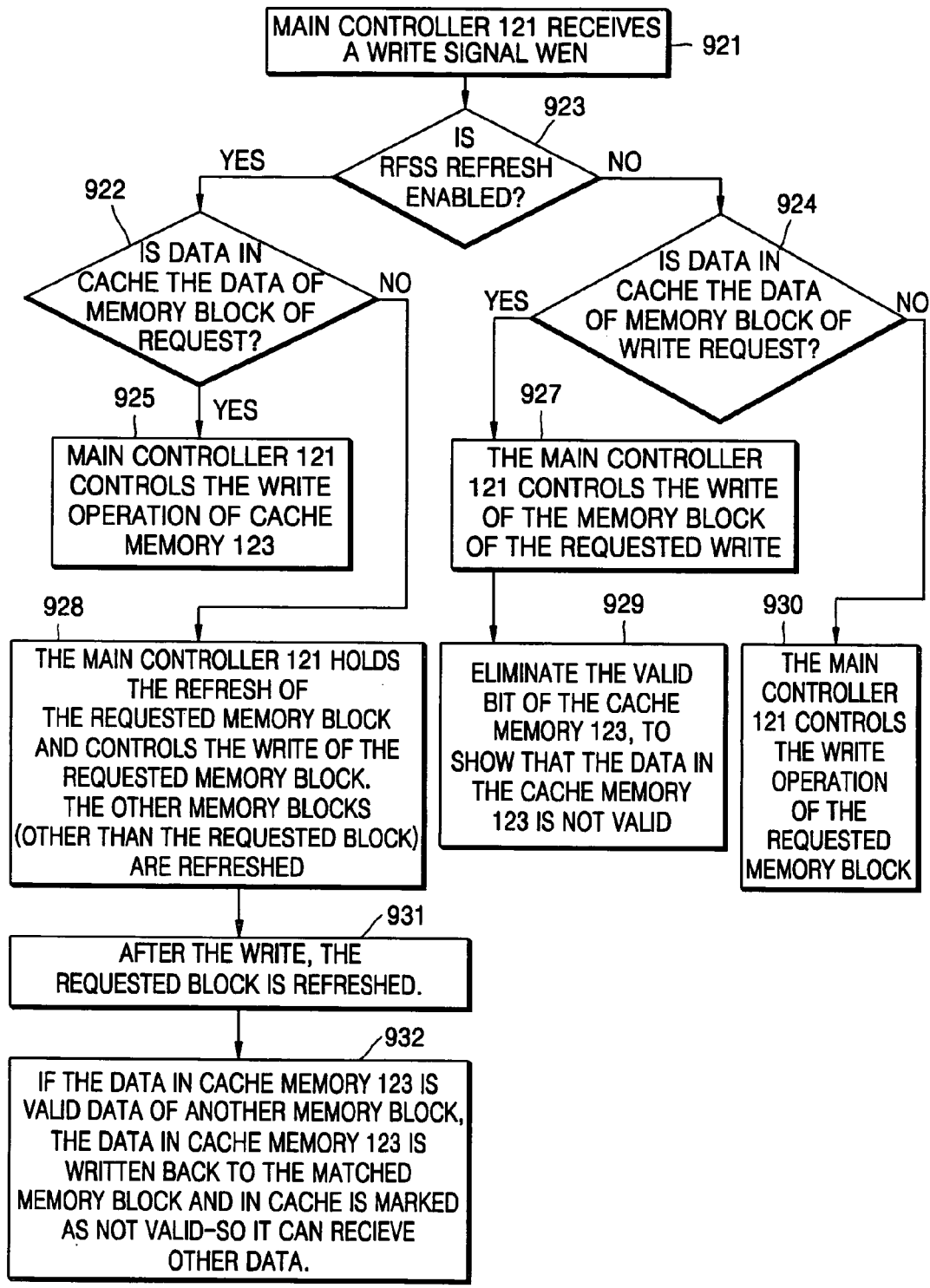
Figures 2, 2B:
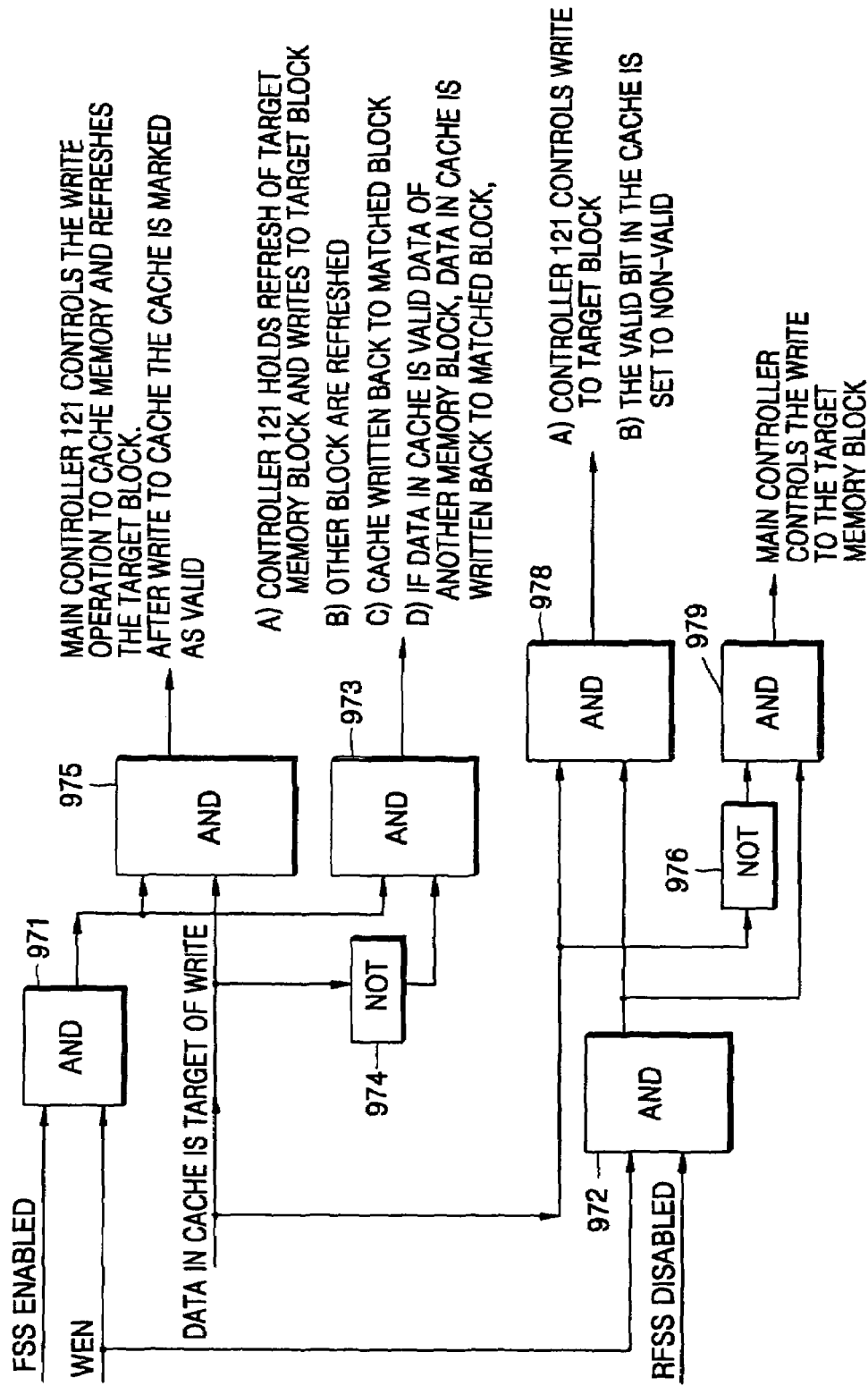

FIGS. 2B-1 and 2B-2 shows what occurs when the RFSS refresh signal is enabled and the main controlled 121 receives a write signal Wen. FIG. 2B also shows what occurs when the RFSS refresh signal is disabled and the main controlled 121 receives a write signal Wen. FIG. 2B-1 is in the form of a flow diagram and FIG. 2B-2 is a logical block diagram. Both Figures shown the same thing in different ways.

Figure 2C:
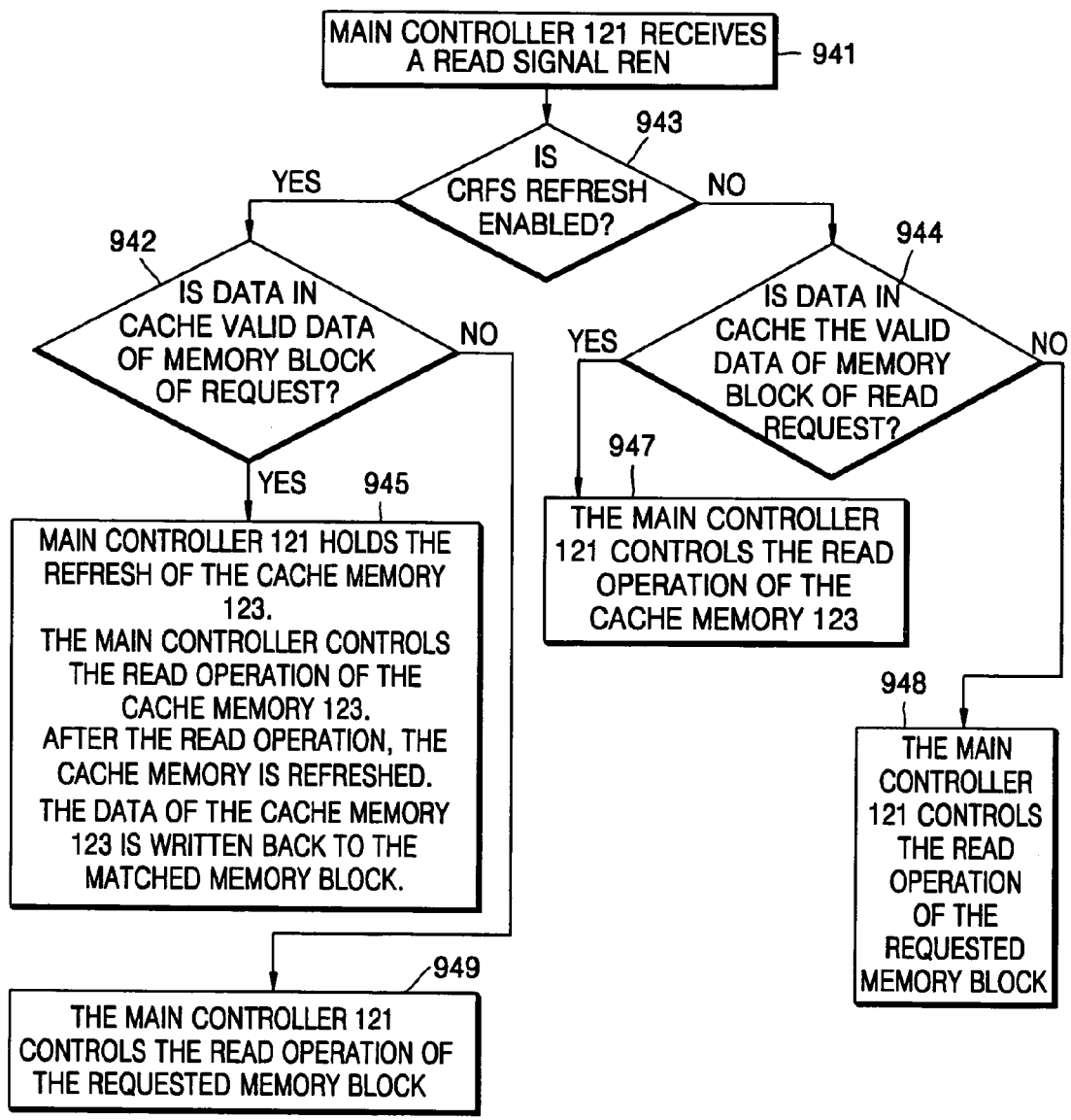
FIGS. 2C and 2D illustrate operations that take place related to cache refresh.

FIG. 2C shows what occurs when the CRFS refresh signal is enabled and the main controlled 121 receives a read signal Ren. FIG. 2C also shows what occurs when the CRFS refresh signal is disabled and the main controlled 121 receives a read signal Ren.

Figure 2D:
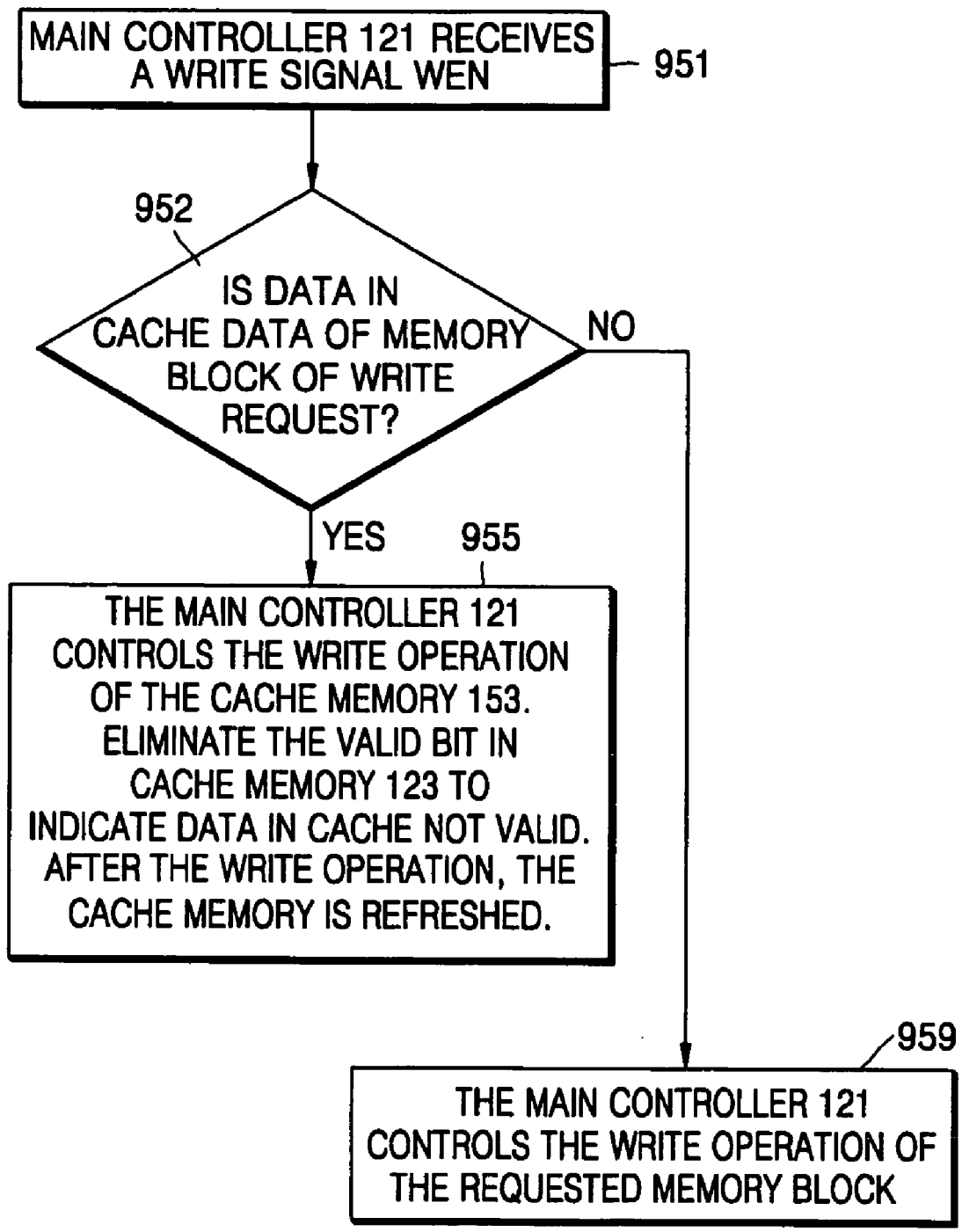

FIG. 2D shows what occurs with the CRFS cache refresh signal enabled or disabled when the main controlled 121 receives a write signal Wen.

The operations shown in the flow diagrams 2A to 2F will now be described in detail.

FIGS. 2A-1 and 2A-2: Both of these figures explain the operations the operations that occur when a Ren signal (a read signal) is received. That is, both of these figures shown the same thing; however, due to the complexity of the operations the information is presented in two different ways to insure clarity. Both of these figures describe what occurs. The actual circuitry that performs the operations shown in these figures is shown in FIGS. 3 to 10.

The particular operations that occur when a Ren signal is received depend upon the several factors including (1) state of the RFSS signal, (2) whether the requested data is in the cache memory and (3) whether or not the data in the cache is valid data.

In FIG. 2A-1, the receipt of a Ren signal is indicated by block 901. The specific operations that occur when a Ren signal is received depend on whether or not the RFSS refresh signal is enabled or disabled as indicated by block 902. In FIG. 2A-2 this is indicated by AND block 961 and 961.

When a Ren signal is received and the RFSS refresh is enabled, the operations that occur also depend on whether or not the data in cache memory 123 is valid data from the memory block that has been requested. In FIG. 2A-1 this is indicated by block 907. In FIG. 2A-2, this is indicated by AND blocks 962, 963 and 966.

If the data in cache memory 123 is valid the data from the memory block that has been requested, the main controller 121 controls the read operation of cache memory 123 and the memory blocks are refreshed. In FIG. 2A-1 this is indicated by block 905 and in FIG. 2A-2 this is indicated by at the output of block 962.

If the data in cache memory 123 is not valid data from the memory block that has been requested, the action taken depends upon whether or not the data in the cache is valid data from some other memory as indicated by block 906. If the data in the cache is valid data of some other memory block, the operations indicated by blocks 908, 911 and 913 in FIG. 2A-1 take place. These are the operations listed on the right of block 967 in FIG. 2A-2. The operations are:

1) The main controller 121 holds (a) the refreshes of the memory block matched to the cache memory 123 and (b) the requested memory block. The main controller 121 does proceed to control the refresh of the other memory blocks.

2) The data in the cache memory 123 is written back to the memory block that matches the data in the cache.

3) A read operation is performed from the requested memory block.

4) The requested data is written to the cache memory.

5) After the above operations, the matched memory block and the requested memory block are refreshed.

If the test at block 906 indicates that the data in the cache 123 is not valid data, the operations indicated by blocks 909, 912 and 924 in FIG. 2A-1 are performed. These operations are also shown at the output of block 9698 in FIG. 2A-2. That is:

1) The main controller 121 holds the refresh of the requested memory block and controls the refreshes of the other memory blocks.

2) A read operation is performed from the requested memory block and at the same time the requested memory block is written to the cache memory 123

3) After the read operation, the requested memory block is refreshed.

If the test at block 902 indicates that the refresh is not enabled, the operations indicated by blocks 904, 907 and 910 are performed. As indicated by block 904, different actions are taken depending on whether or not the data in the cache is valid data of the data in the memory block requested. If the data in the cache is valid data of the data in the memory block requested, the main controller 121 controls the read operation of the cache memory 123. If the data in the cache is not valid data of the data in the memory block requested, the main controller 121 controls the read operation of the requested memory block.

The net result of the operations explained above is that the refresh of the DRAM memory is effectively hidden from the other operations that take place during a memory read operation. Furthermore, if the data in the cache is not valid data, the read operation is performed on the requested memory block and at the same time the requested block is written to the cache. In this situation there is no write back operation.

FIGS. 2B-1 and 2B-2: Both of these figures explain the operations the operations that occur when a Wen signal (a right signal) is received. That is, both of these figures shown the same thing; however, due to the complexity of the operations the information is presented in two different ways to insure clarity. Both of these figures describe what occurs. The actual circuitry that performs the operations shown in these figures is shown in FIGS. 3 to 10.

The particular operations that occur when a Wen signal (a write signal) is received depend upon (1) the state of the RFSS signal, and (2) whether or not the data in the cache is data corresponding to the target block of the Wen signal. The process begins when the signal Wen is received as indicated by block 921.

As illustrated in FIG. 2B-1 the operations that occur depend on whether or not the refresh signal RFSS is enabled or disabled as indicated by block 923. In FIG. 2B-2 this is illustrated by AND circuits 971 and 972.

If the RFSS refresh signal is enabled the operations indicated by blocks 922, 925, 928, 931 and 932 occur. Different operations occur depending on whether or not the write request is to a memory block, the data from which is in the cache memory 123. This is indicated by block 922. The same decision process is illustrated by blocks 972 and 973 in FIG. 2B-2.

If the write operation is to a memory block, the data from which is in the cache memory 123, the main controller 121 controls the write operations to the cache memory 123 as indicated by block 925 and the corresponding block in main memory is refreshed. After the write operation the valid data bit is set in the cache memory.

If the data in the cache is not the data from the memory block to which the write operation is directed, the operations indicated by blocks 928, 931 and 932 take place. As indicated by block 928 the main controller 121 hold the refresh operation of the requested memory block and controls the write operation to the requested memory block. A refresh operation is performed on the other memory blocks (except the requested memory block). After the write operation, the requested memory block is refreshed as indicated by block 931.

If the data of the cache memory 123 is a valid data of another memory block, the data of the cache memory 123 is written-back to the matched memory block and the data in the cache memory is marked as not valid. Since the data is marked as not valid, it can receive other data. This is indicated by block 932.

If the refresh is disabled when the write signal is received, the operations indicated by blocks 924, 927, 929 and 930 occur. As indicated by block 924, operations 927 and 929 occur if the data in the cache is the data of the memory block to which the write is directed.

If the data in the cache is the data of the memory block to which the write is directed the main controller 121 controls the write operation of the requested memory block. The valid bit in the cache memory 123 is turned off so that the memory controller shows that the data of the cache memory 123 is not valid. This is indicated by block 929. This is indicated by block 978 in FIG. 2B-2.

If the data in the cache is not the data of the memory block to which the write is directed the main controller 121 controls the write operation of the requested memory block as indicated by block 930 in FIG. 2B-1 and by block 978 in FIG. 2B-2.

Thus, as indicated above the refresh operation does not interfere with a write operation, that is, a write operation is not prolonged by the refresh.

FIG. 2C: FIG. 2C relates to those operations that depend on whether or not the CRFS refresh signal is enabled or disabled when a Ren signal is received.

Block 943 divides the operations into those that occur when CRFS is enabled and when CRFS is disabled. If CRFS is enabled the operations further depend on whether or not the data in the cache 123 is valid data of the memory block to which the read request is directed as indicated by block 942.

If the data in the cache is valid data of the memory block specified in the read request, the operation indicated in block 945 occur. That is, the main controller 121 holds (that is, delays) the refresh of the cache memory 123 and controls the read operation from the cache memory 123. After the read operation is compete, the cache memory 123 is refreshed and the data in the cache memory 123 is written-back to the matched memory block.

If the data in the cache is not valid data of the memory block specified in the read request, the operation indicated in block 949 occur. That is, the main controller 121 controls the read operation from the requested memory block.

If CRFS is disabled the operations indicated by blocks 944, 947 and 948 occur. However, in order to avoid confusion, in this particular situation, it must be noted that there can be two types of valid data in the cache. The data can be either "read valid" or "write valid". The data in the cache may be read valid data of a memory block specified in a read request; however, when considering the actual memory block in the main memory, the data in the cache may not be write valid in that the data in the main memory block may differ from the data in the cache.

It is noted that in some instances, when referring to data in the cache, the term "valid data" is used. In other instances, the terms "valid write data" and "valid read data" is used. In those instances where the term "valid data" is used without specifying "valid write data" or "valid read data", there is no need to differentiate between read data and write data.

In the situation illustrated in FIG. 2C, blocks 944, 947 and 948, the operations that occur depend upon whether or not the data in the cache is write-valid data of the memory block specified in the read request. This decision is indicated by block 944.

If the data in the cache is write-valid data of the memory block specified in the read request, the operations indicated by block 947 occur. That is, the main controller 121 controls the read operation of the cache memory 123.

If the data in the cache is not write-valid data of the memory block specified in the read request the operations indicated by block 948 occur. That is, the main controller 121 controls the read operation of the requested memory block.

FIG. 2D: As indicated above, both FIGS. 2B and 2D show operations that occur when the system receives a write signal Wen. The operations shown in FIG. 2D are operations that occur when the CRFS refresh signal is either enabled or disabled.

As indicated by block 952, the operations that occur are dependent upon whether or not the data in cache memory 121 is data from the memory block specified in the write request.

If the data in the cache memory 121 is data from the same memory block as specified in the write request, the operations specified in block 955 occur. That is, the main controller 121 controls the write operation to the memory block specified in the write request. The "valid bit" in the cache memory 123 is turned off since the data in the cache is no longer valid. After the write operation, the cache memory 123 is refreshed.

If the data in the cache memory 121 is not data from the same memory block as specified in the write request, the operations specified in block 959 occur. That is, the main controller 121 controls the write operation of the requested memory block.

Operation of the System: The general operation of the system will now be described. In this description, reference will be made to the units and signals shown in FIG. 1.

The refresh control signal CRFS and the refresh address signal RFA are periodic signals. In the particular specific preferred embodiment described here, there are twenty word lines and the pre-determined refresh time is one hundred micro seconds. That is five micro seconds for the $1^{st}$ word line, five micro seconds for the $2^{nd}$ word line, five micro seconds for the $3^{rd}$ word line, etc. giving a total of 100 micro seconds.

The refresh order is as follows: In response to the refresh control signal CRFS and the refresh address signal RFA, the Cache Memory 123 refreshes the memory cells connected to the word line W1 and enables the refresh start signal RFSS.

In response to the refresh start signal RFSS and the refresh address signal RFA, the Memory Blocks M1~Mn simultaneously refresh the memory cells connected to the word line W1. In response to the refresh control signal CRFS and the refresh address signal RFA, the Cache Memory refreshes the memory cells connected to the word line W2 and enables the refresh start signal RFSS. In response to the refresh start signal RFSS and the refresh address signal RFA, the Memory Blocks M1~Mn simultaneously refresh the memory cells connected to the word line W2, etc.

Refresh when data in cache is valid data: The following occur when RFSS is enabled, the data in the cache is valid, and the Main Controller 121 receives a read signal Ren or a write signal Wen. The Main Controller 121 confirms that the bank address signal BA is equal to the previous bank address signal BA_P and that the data of the Cache Memory 123 is valid.

Cache Memory data is valid, the Cache Information Controller 200 enables a cache address hit signal CAH, a cache read or write hit signal CRH or CWH, and a cache memory hit signal CH. The Cache Memory Controller 400 enables a cache read or write control signal CR or CW, 1 and 2 strobe signals CASB, RASB, a pre-charge control signal PRCB and a read or write control signal REN or WEN.

As a result, the Cache Memory does a read or write operation and the Memory Blocks can refresh Refresh when data in cache is NOT valid data: If the bank address signal BA is not equal to the previous bank address signal BA_P, the Cache Memory Controller 200 disables a cache address hit signal CAH, a cache read or write hit signal CRH or CWH, and a cache memory hit signal CH.

The Cache Memory Controller 400 enables the cache read control signal CR, a cache re-write control signal CWB, 1 or 2 strobe signal CASB, RASB, a sense amp control signal SENB, the pre-charge control signal PRCB and the read control signal REN and outputs re-write address signal CWBRC. In response to the re-write address signal CWBRC, the Memory Block Controller 300 enables one of memory re-write control signals CWB1~CWBn.

In response to the bank address BA, the Memory Block Controller 300 enables one of the memory read control signal MR1~MRn or one of the memory write control signals MW1~MWn.

Example A: The following is an example of the operations that occur when the Cache Memory data equals the Memory Block M2 data and the target of a read signal Ren equals the Memory Block M1.

The Memory Block Controller 300 enables the memory re-write control signal CWB2 and the memory read control signal MR1. The Cache Memory 123 does a read operation in response to the cache read control signal CR. In response to the memory re-write control signal CWB2, the Memory Block M2 holds a refresh and writes a cache read data CDAT.

In response to the memory read control signal MR1, the Memory Block M1 holds a refresh and does a read operation, and the memory read data MDAT is outputted through the I/O Driver 140. The other Memory Blocks M3~Mn refresh in response to the refresh start signal RFSS.

When the Memory Block M2 finishes re-writing or the Cache Memory 123 does a next read operation, the Memory Block Controller 300 disable the memory re-write control signal CWB2 and controls the refresh of the Memory Block M2. After the re-writing process of the Cache Memory 123, the Cache Memory Controller 400 enables a cache write control signal CW and the Cache Memory 123 write a memory read data MDAT.

When one of the Memory Blocks M3~Mn and the Cache Memory 123 do a read operation by the next read signal Ren, the Memory Block Controller 300 disables the memory read control signal MR1 and controls a refresh of the Memory Block M1.

Example B: The following is an example of what occurs when the Cache Memory data equals the data in Memory Block M2 and the target of a write signal Wen equals Memory Block M1.

The Memory Block M2 holds the refresh operation until the Memory Block M2 finishes re-writing or the Cache memory 12) writes the input data IDAT in response to the next write signal. The other Memory Blocks M3~Mn are refreshed. In response to the memory write control signal WR1, the Memory Block M1 holds the refresh operation and does a write operation.

When one of the Memory Blocks M3~Mn and the Cache Memory 123 does a write operation, by the time of the next write signal Wen or when the input data IDAT is written in the Cache Memory, the Memory Block Controller 300 disables the memory write control signal MR1 and controls the refresh of the Memory Block M1. After re-writing the Cache Memory 123, the Cache Memory Controller 400 enables a cache write control signal CW and the Cache Memory 123 write the input data IDAT.

Operations when RFSS is disabled: If the RFSS signal is disabled, the Memory Blocks M1~Mn are not refreshed. If RFSS is disabled and the Main Controller 121 receives a read signal Ren or a Write Signal Wen, the Memory Controller Block 300 controls the read or write of the Memory Blocks M1~Mn.

Operations when CRFS is enabled: If the CRFS signal is enabled, the Cache Memory 123 is refreshed. If when CRFS is enabled a Ren read signal is received and valid data is in the cache, the following occurs:

The Cache Information Controller 200 enables the cache write hit signal CWH. The Cache Memory Controller 400 enables the read control signal REN, the cache read control signal CR and the cache re-write control signal CWB and outputs the re-write address signal CWBRC.

In response to the refresh control signal CRFS, the cache write hit signal CWH and the read control signal REN, the Cache Memory 123 holds a refresh and does a read operation in response to the cache write control signal CR. The read data CDAT from the Cache Memory 123 is outputted through the I/O Driver 140 and is simultaneously written back to the Memory Block.

After a read operation from the Cache Memory 123, the Cache Information Controller 300 disables the cache write hit signal CW1 and the Cache Memory Controller 400 disables the read control signal REN, the cache read control signal CR and the cache re-write control signal CWB. As a result, the Cache Memory 123 refreshed.

In summary, except for one special case, the main memory gives priority to read or write operations over refresh operations. On the other hand, the cache memory give priority to the refresh operations over read or write operations. The exceptional case is when a memory read signal is received when the cache refresh is enabled and the data in the cache memory is valid. In this exceptional case, the refresh of the cache memory is delayed.

FIGS. 3 to 10 which describe in detail the functional blocks shown in FIG. 1 will now be described.

FIG. 3 shows the units in the Main Controller 121. The Main Controller includes a Cache Information Controller 200, a Memory Block Controller 300, and a Cache Memory Controller 400.

Figure 6:
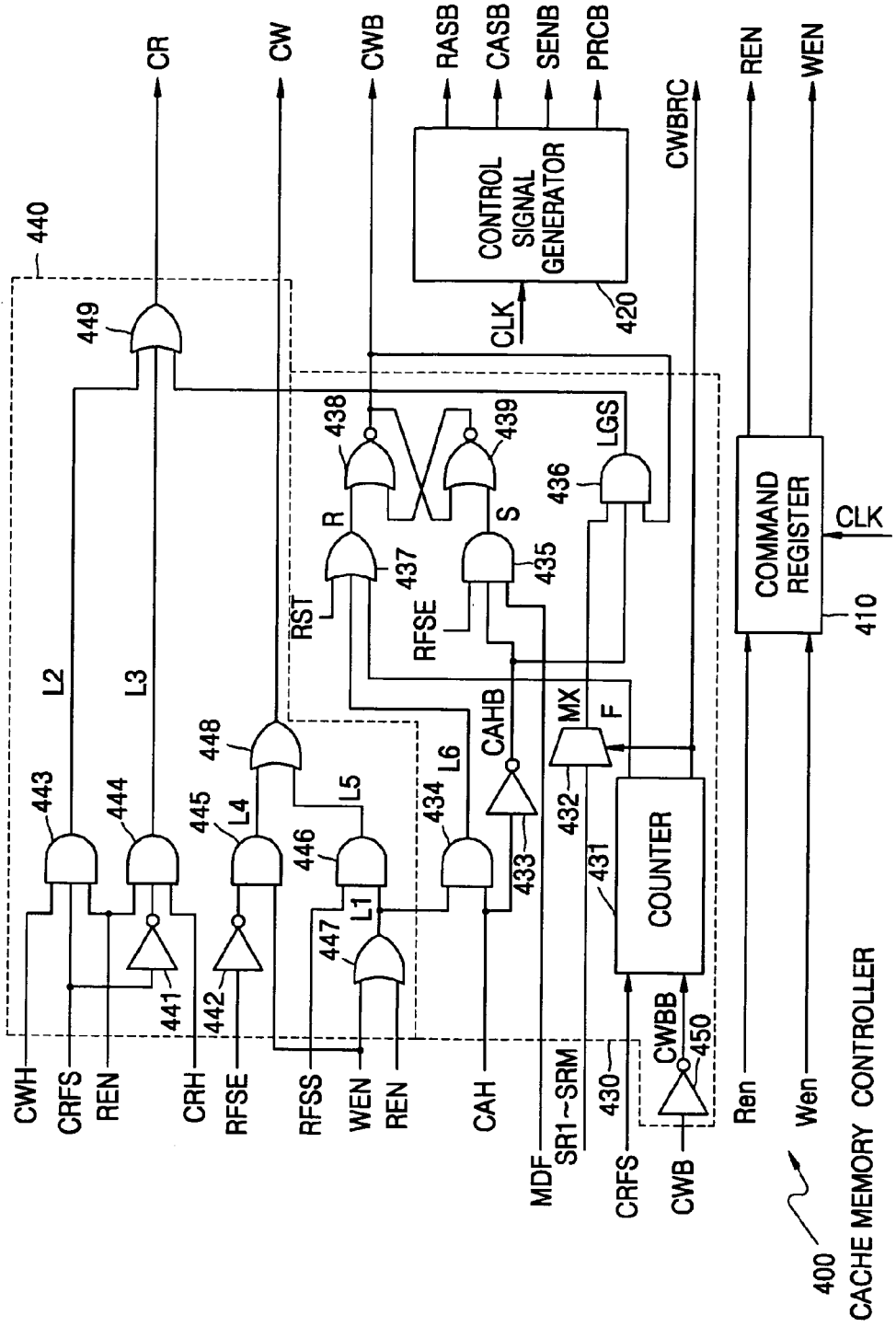

It is noted that block 400 has REN and WEN signals as both inputs and outputs. As indicated in FIG. 6, the read and write signals Ren and Wen are input signals to the Command register 410. REN and WEN are output signals from the command register 410. REN and WEN are used as inputs to circuits 443, 444 and 44 in memory controller 400. Showing the connecting lines causes the drawings to be too crowded. Thus REN and WEN are shown as inputs to circuits 443, 444, and 447. This results in memory controller 400 having REN and WEN signals as both input and output signals.

Functions performed by Cache Information Controller 200: The Cache Information Controller 200 stores the information that indicates which memory block is matched to the data of the Cache Memory 123. The Cache Information Controller 200 also stores the information indicating whether or not the data of the Cache Memory 123 is valid. When the data of the Cache Memory 123 is the same data of the read requested memory block, the Cache Information Controller 200 enables the cache address hit signal CAH. When the data of the Cache Memory 123 is the valid data, the Cache Information Controller 200 enables the cache read hit signal CRH and the cache memory hit signal CH.

When the data of the Cache Memory 123 is data from the memory block specified in a write requested, the Cache Information Controller 200 enables the cache address hit signal CAH. When the data of the Cache Memory 123 is the valid data, the Cache Information Controller 200 enables the cache write hit signal CWH and the cache memory hit signal CH.

When data from the Memory Block MDAT and the input data IDAT is written to the Cache Memory 123, the information in Cache Information Controller 200 is updated.

The Cache Information Controller receives a cache re-write control signal CWB, a cache re-write address signal CWBRC, a bank address BA, a refresh control signal CRFS, and a clock CLK. The Cache information controller outputs a re-write bank address signal CBA and 2nd valid bit signal VW. The Cache Information Controller is reset in response to a reset signal RST.

Memory Block Controller 300 generates the memory read control signals MR1~MRn, the Memory write control signal MW1~MWn and the memory re-write control signals CWB1~CWBn.

The above listed signals are generated when either a read control signal REN or a write control signal WEN is enabled. The above signals also depend upon (or are in response to) the clock signal CLK, the cache re-write control signal CWB, a refresh start signal RFSS, and a refresh information signal RFSE.

Cache Memory Controller 400 enables the read control signal REN or the write control signal WEN when it receives the read signal Ren or the write signal Wen. The Cache Memory Controller 400 outputs the 1st and 2nd strobe signals CASB, RASB, sense amp control signal SENB, and pre-charge control signal PRCB in response to the clock signal CLK.

When the read control signal REN or the write control signal WEN is enabled, the Cache Memory Controller 400 outputs a cache read control signal CR, a cache write control signal CW or the cache re-write control signal CWB. These signals are in response to the refresh control signal CRFS, the refresh start signal RFSS, and the refresh information signal RFSE.

Figure 4:
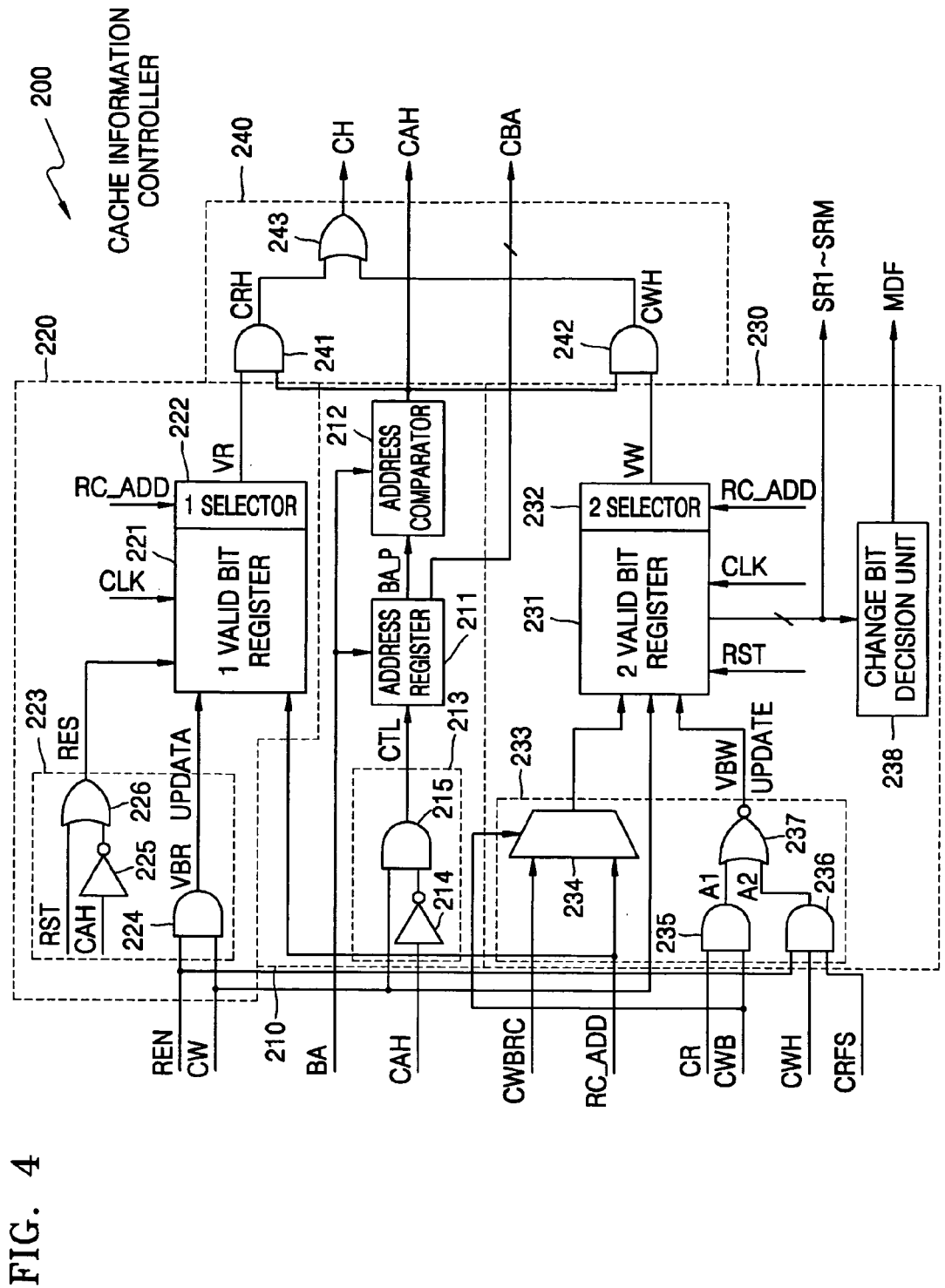
FIGS. 4, 5 and 6 are more detailed diagrams of units shown in FIG. 3.

Details of Cache Information Controller 200 (FIG. 4): FIG. 4 is a logical circuit diagram of the Cache Information Controller 200. The Cache Information Controller 200 includes an Address Compare Circuit 210, 1 and 2 Valid Bit Check Circuits 220, 230, and a Output Logic Circuit 240.

The Address Compare Circuit 210 includes an Address Register 211, an Address Comparator 212, and a Logic Circuit 213 which includes an Inverter 214 and an AND gate 215.

When the cache address hit signal CAH is disabled and the cache write control signal CW is enabled, the Logic Circuit 213 enables a register control signal CTL. When the register control signal CTL is enabled, the Cache Address register 211 stores a preset bank address signal BA and outputs the stored bank address signal BA as a previous bank address signal BA_P.

The Address Comparator 212 compares the previous bank address signal BA_P with the present bank address signal BA. If the previous bank address signal BA_P and the present band address signal BA are same, the Address comparator 212 enables the cache address hit signal CAH. If these signals are not same, the cache address hit signal CAH is disabled.

Dotted boxes 220 and 230 indicate the components that form the Valid Bit Check Circuits. These circuits store information related to the data stored in the Cache Memory 123. They are referred to as 1 and 2 Valid Bit Check Circuits.

A memory read data signal MDAT for Memory Blocks M1~Mn is used to store data in the Cache Memory 123. The 1 Valid Bit Check circuit 220 stores information indicating that the data of the Cache Memory 123 is valid.

1 Valid Bit Check Circuit 220 includes a 1 Valid Bit Register 221, a 1 Selector and 1 Logic Circuit 223 which includes an AND gate 224, an Inverter 225 and an OR gate 226. When the read control signal REN and the cache write control signal CW are enabled, the AND gate 224 enables and outputs the 1 update signal VBR. When the cache address hit signal CAH is disabled or a reset signal RST is enabled, the reset control signal RES is enabled.

When the 1 update signal VBR is enabled, the 1 Valid Bit Check Circuit 220 stores the 1 update signal VBR in the 1 Valid Bit Register 221 in response to the clock signal CLK and the row/column address signal RC_ADD. That is, a Logic 1 is stored in the 1 Valid Bit Register 221.

When the reset control signal RES is enabled, all data stored in the 1 Valid Bit Register is reset. The 1 Selector selects sequentially the bits stored in the 1 Valid Bit Register 221 and outputs a 1 valid bit signal VR.

When a input data IDAT is stored in the Cache Memory 123, the information that the data of the Cache Memory 123 is valid is stored in the 2 Valid Bit Check Circuit 230. The 2 Valid Bit Check Circuit 230 includes a 2 Valid Bit Register 231, a 2 Selector 232, a 2 Logic Circuit 233 and a Change Bit Decision Unit 238. The 2 Logic Circuit 233 includes a multiplexer 234, an AND gates 235, 236 and NOR gate 237

When a cache re-write control signal CWB is enabled or disabled, the multiplexer 234 outputs a re-write address signal CWBRC or the row/column address signal RC_ADD respectively. When the cache read control signal CR and the cache re-write control signal CWB are all enabled, the AND gate 235 enables a logic signal A1. When the read control signal REN, the cache write hit signal CWH, and the refresh control signal CRFS are all enabled, the AND gate 236 enables a logic signal A2.

When the logic signals A1, A2 are all disabled, the NOR gate 237 enables the 2 update signal VBW. When the 2 update signal VBW is enabled, the 2 Valid Bit Register 231 stores sequentially the 2 update signal VBW in response to the clock signal CLK and the row/column address signal RC_ADD, so the bits of the 2 Valid Big Register 231 are logic 1.

When the 2 update signal VBW is disabled, the 2 Valid Bit Register 231 stores sequentially the 2 update signal VBW in the 2 Valid Bit Register 231 as logic 0 in response to the clock signal CLK and the re-write address signal CWBRC.

When the reset signal RST is enabled, the bits of the 2 Valid Bit Register 231 are reset If the bits of the 2 Valid Bit Register are logic 1, the data of the Cache Memory 123 is valid and if the bits of 2 Valid Bit Register are logic 0, the data of the Cache Memory 123 is not valid. The 2 Valid Bit Register 231 outputs all bits of the 2 Valid Bit Register 231 as a information bits SR1~SRM. The 2 Selector 232 selects sequentially the bits stored in the 2 Valid Bit Register and outputs a 2 valid bit signal VW.

The Change Bit Decision Unit 238 receives the information signals SR1~SRM, and decides if there are changed bits in the information signals SR1~SRM. It outputs the changed bit signal MDF. If there is a change bit, the Change Bit Decision Unit 238 enables the change bit signal MDF. The output logic circuit 240 includes an AND gates 241, 242 and OR gate 243.

The AND gate 241 outputs a cache read hit signal CRH in response to the 1 valid bit signal VR and the cache address hit signal CAH. The AND gate 242 outputs a cache write hit signal CWH in response to the 2 valid bit signal VW and the cache address hit signal CAH.

Figure 5:
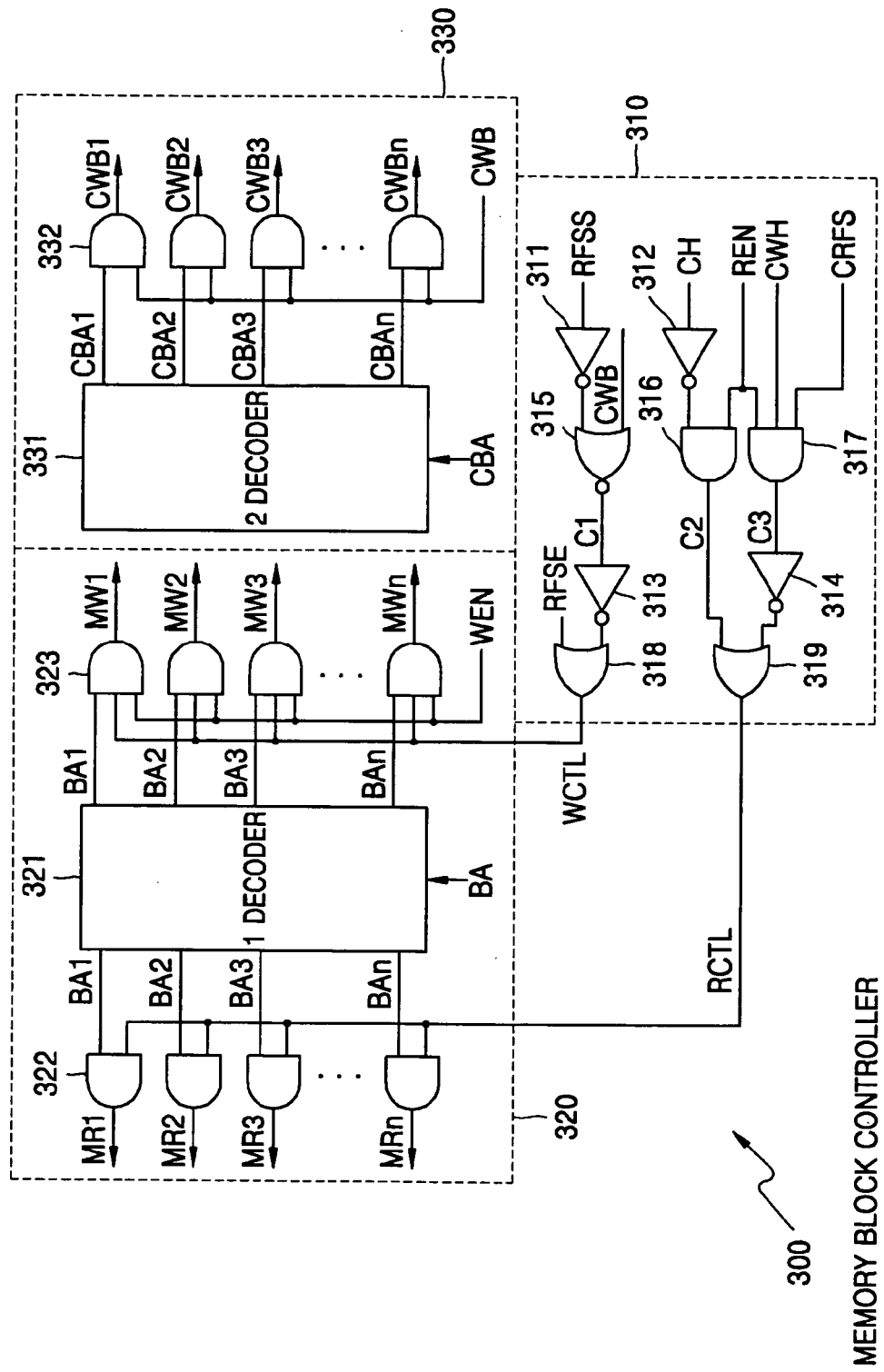

Details of Memory Block Controller 300 (FIG. 5): The details of the logic in Memory Block Controller 300 are shown in FIG. 5. The Memory Block Controller 300 includes a Control Logic Circuit 310, a 1 Decoding circuit 320 and a 2 Decoding circuit 330 (shown by the dotted line boxes in the Figure).

The Control Logic Circuit 310 includes Invertors 311~314, NOR gate 315, AND gates 316, 317 and OR gates 318, 319. When either the refresh information signal RFSE or the cache re-write control signal CWB is enabled or the refresh start signal RFSS and the cache re-write control signal CWB are simultaneously enabled, the Control Logic Circuit 310 enables a write select signal WCTL.

When the read control signal REN is enabled and the cache memory hit signal CH is disabled, the Control Logic Circuit 310 enables a read select signal RCTL. When either the read control signal REN, the cache write hit signal CWH or the refresh control signal CRFS is disabled, the read select signal RCTL is enabled.

The 1 Decoding Circuit 320 includes 1 Decoder 321, AND gates 322 and AND gates 323. The 1 Decoder 321 decodes a bank address signal BA and outputs a plurality of 1 decoding signals BA1~BAn.

When the read select signal RCTL and a plurality of 1 decoding signals BA1~BAn are enabled, the AND gates 322 enable a selected plurality of memory read control signals MR1~MRn. When one of the memory read control signasl MR1~MRn is enabled, one of the memory blocks M1~Mn does a read operation.

The AND gates 323 output a plurality of memory write control signals MW1~MWn in response to the write control signal WEN, the write select signal WCTL, and a plurality of decoding signals BA1~Ban. When the write control signal WEN, the write select signal WCTL and a plurality of 1 decoding signals BA1~BAn are enabled, the AND gates 323 enable a selected plurality of memory write control signals MW1~MWn. When one of the memory write control signals MW1~MWn is enabled, one of the memory blocks M1~Mn does a write operation.

The 2 Decoding Circuit 330 includes a 2 Decoder 331 and AND gates 332. The 2 Decoder 331 decodes a re-write bank address signal CBA and outputs a plurality of 2 decoding signals CBA1~CBAn. When the cache re-write control signal CWB and a plurality of 2 decoding signals CBA1~CBAn are enabled, the AND gates 332 enable a plurality of memory re-write control signals CWB1~CWBn.

When one of the memory re-write control signals CWB1~CWBn is enabled, one of the memory blocks M1~Mn does a re-write operation.

Details of Cache Memory Controller 400 (FIG. 6): FIG. 6 shows the detailed logic in the Cache Memory Controller 400.

The Cache Memory Controller 400 includes a Command Resistor 410, a Control Signal Generator 420, a 1 Control Logic Circuit 430 and a 2 Control Logic Circuit 440. The 1 Control Logic Circuit 430 and a 2 Control Logic Circuit 440 are shown by the dotted lines in the Figure.

The Command Register 410 stores the read signal Ren in response to the clock signal CLK and outputs read control signal REN. The Command Register 410 stores the write signal Wen in response to the clock signal CLK and outputs write control signal WEN. The Control Signal Generator 420 outputs a 1 and 2 strobe signals CASB, RASB, a sense amp control signal SENB and a pre-charge control signal PRCB in response to the clock signal CLK.

The 1 Control Logic Circuit 430 includes Counter 431, Multiplexer 432, Inverters 433, 450, AND gates 434~436, OR gate 437 and NOR gates 438~439. The 1 Control Logic Circuit 430 outputs the cache re-write control signal CWB and a logic signal LGS in response to the read control signal, the write control signal, the cache address hit signal CAH, the change bit signal MDF, the refresh control signal CRFS and information bits SR1~SRM.

The 2 Control Logic Circuit 440 includes Inverters 441, 442, AND gates 443~446 and OR gates 447~449. The 2 Control Logic Circuit 440 outputs a cache write control signal CW in response to the read or write control signal REN or WEN, the refresh start signal RFSS and the refresh information signal RFSE.

The 2 Control Logic Circuit 440 outputs a cache read control signal CR in response to the refresh control signal CRFS, the read control signal REN, the cache writer or read hit signal CWH or CRH, and logic signal LGS.

Details of Cache Memory 123 (See FIG. 7): The details of the Cache Memory are shown in FIG. 7. The Cache Memory 123 includes Control Signal Generator 510, Multiplexer 520, Memory Cell Array 530, Row Decoder 540, Word Line Driver 550, Column Decoder 560, Sense Amp Circuit 570, Pre-charge Circuit 580 and Bus Driver 590. Memory Cell Array 530 is an DRAM memory array which must be refreshed to retain data.

Depending on whether the address select signal CRFSS is enabled or disabled, the Multiplexer 520 outputs the refresh address signal RFA or the row address signal R-ADD, respectively. The row address signal R_ADD includes some low side bits of the row/column address signal RC_ADD. (For example, if RC_ADD=8 bits then R_ADD=6 low side bits).

When the Cache Memory 123 is refreshed, the Control Signal Generator 510 disables the decoding control signal CASBc, therefore, the Column Decoder 560 is disabled and the Row Decoder 540 is enabled. In response to the refresh address signal RFA the Row Decoder 540 controls that the Word Line Driver 550 and sequentially enables the word lines W1~W64.

When the Cache Memory does a write or read operation, the Control Signal Generator 510 enables the decoding control signal CASBc, and the Column Decoder 560 is enabled.

Figure 8:
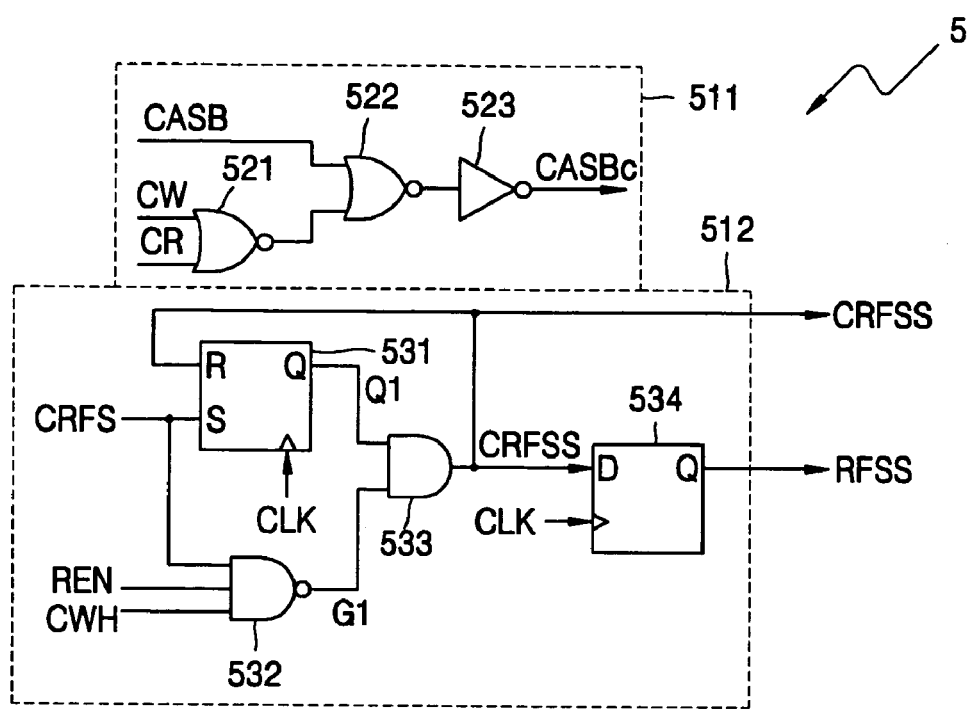
FIG. 8 is a logical circuit diagram of the control signal generator in the cache memory.

Details of Control Signal Generator 510 (FIG. 8): The detail logic in the Control Signal Generator 510 is shown in FIG. 8. The Control Signal Generator 510 includes a 1 Logic Circuit 511 and 2 Logic Circuit 512. These are shown by the dotted line boxes in FIG. 8.

When the 1 strobe signal CASB is enabled, one of the cache write control signal CW is enabled, and the cache read control signal CR is enabled, the 1 Logic Circuit 511 enables the decoding control signal CASBc.

The 2 Logic Circuit 512 includes an RF type flip flop 531, a NAND gate 532, an AND gate 533 and a D type Flip Flop 534. When the refresh control signal CRFS, the read control signal REN, the cache write hit signal CWH and the clock signal CLK appear, the 2 Logic Circuit 512 outputs an address select signal CRFSS and refresh start signal RFSS.

Figure 10:
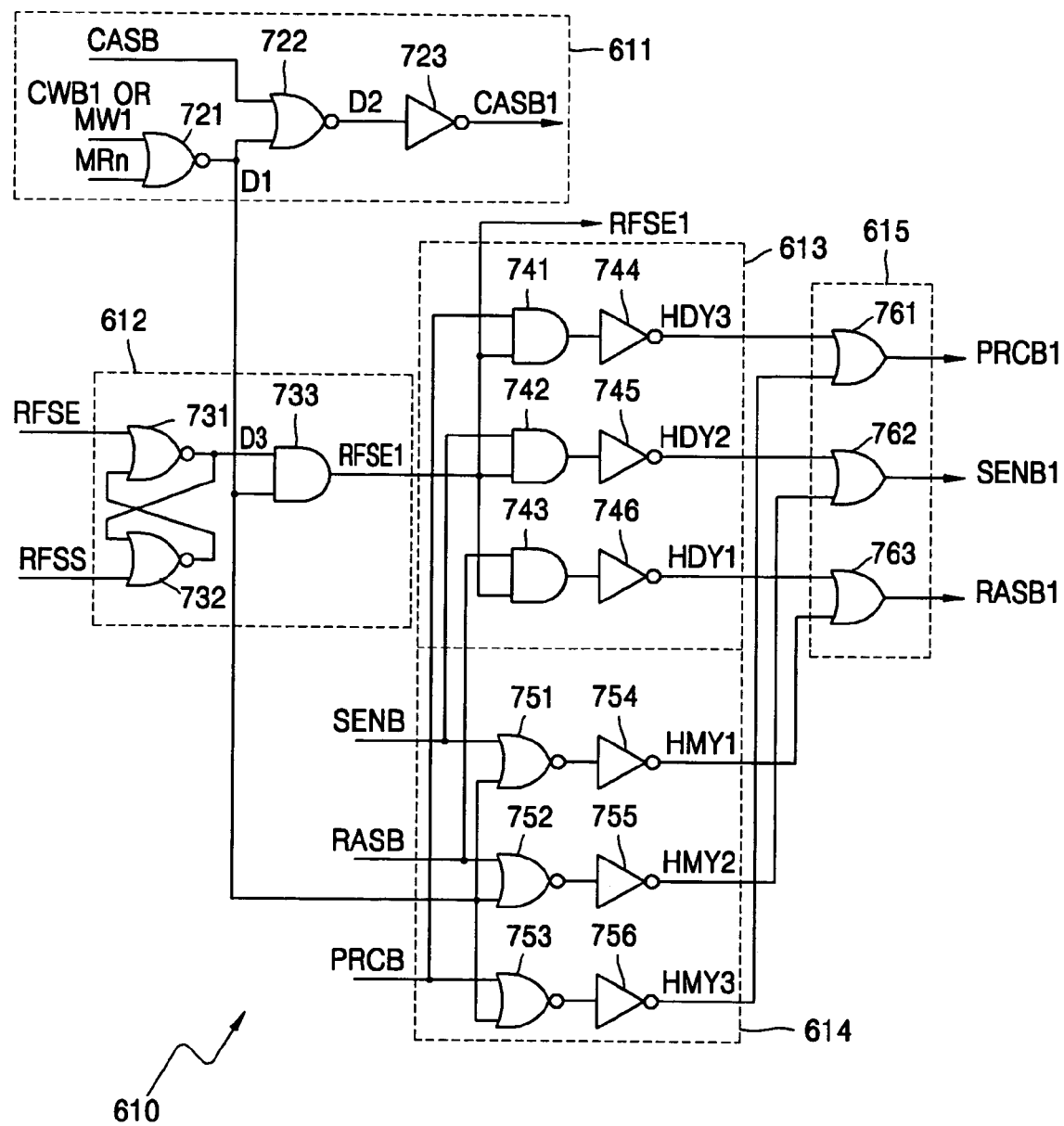
FIG. 10 is a logical circuit diagram of the control signal generator in each memory block.

Details of an Exemplary Memory Block and the Control Signal Generator in the Memory Block (FIG. 9): FIG. 9 shows the details of memory block M1. The memory block includes some conventional components but it includes special logic. It is noted that all the memory blocks M1~Mn are identical. The memory blocks consist of DRAM memory which must be refreshed to retain data. The Memory block includes a Control Signal Generator 610. The detail logic in the Control Signal Generator is shown in FIG. 10.

In addition to the Control Signal Generator 610, the Memory Block M1 includes Multiplexers 620, 630, 710, a Memory Cell Array 640, a Row Decoder 650, a Word Line Driver 660, a Column Decoder 670, a Sense Amp Circuit 680, a Pre-charge Circuit 690 and a Bus Driver 700.

The Control Signal Generator 610 is responsive to the 1 and 2 strobe signals CASB, RASB, a Memory write control signal MW1 or a Memory re-write control signal CWB1, a memory read control signal MR1, a refresh start signal RFSS, a refresh information signal RFSE, a sense amp control signal SENB and a pre-charge control signal PRCB. The Control Signal Generator 610 outputs 1 and 2 decoding control signals CASB1, RASB1, a refresh state signal RFSE1, a sense amp control signal SENB1 and a pre-charge control signal PRCB1.

The Control Signal Generator 610 includes Logic Circuits 611~615 (shown in the Figure by the dotted line boxes). The Logic Circuit 611 includes NOR gates 721, 722 and an Inverter 723. In response to the memory write control signal MW1, the memory read control signal MR1 and the 1 strobe signal CASB, the Logic Circuit 611 outputs a 1 decoding control signal CASB1.

When the 1 strobe signal CASB is enabled and one of the memory read control signal MR1 and the memory write control signal MW1 is enabled, the Logic Circuit 611 enables the 1 decoding control signal CASB1.

Through the Logic Circuits 612, 613, 614, and 615, the Control Signal Generator 610 outputs a pre-charge control signal PRCB1, sense amp control signal SENB1 and decoding control signal RSAB1.

The Multiplexer 620 (see FIG. 9) outputs one of the re-write row address signal CWBR, the row address signal R_ADD and the refresh address signal RFA in response to the refresh state signal RFSE1 and the memory re-write control signal CWB1. The multiplexer 620 operates as follows:

| RFSE1 | CWB1 | Output |
| --- | --- | --- |
| Enable | Disable | RFA |
| Disable | Enable | CWBR |
| Disable | Disable | R_ADD |

The row address signal R_ADD is a part of the row/column address signal RC_ADD. The re-write row address signal CWBR is a part of the re-write address signal CWBRC that is connected to the Counter 431 of the Cache Memory Controller 400.

The multiplexer 630 outputs one of the column address signal C_ADD and re-write column address signal CWBC in response to the memory re-write control signal CWB1. When the memory re-write control signal CWB1 is enabled, the re-write column address signal CWBC is outputted and when the memory re-write control signal CWB1 is disable, the column address signal C_ADD is outputted. The column address signal C_ADD is a part of the low side bits of the row/column address signal RC_ADD.

The structure of the Memory Cell Array 640 is substantially same to the Memory Cell Array 530 of the Cache Memory 123 shown in FIG. 7. When the write control signal WEN is enabled or disabled, the Multiplexer 710 outputs the input data IDAT or the cache read data CDAT, respectively.

In response to the memory write control signal MW1, the Bus Driver 700 outputs signal from the Multiplexer 710 to the Memory Cell Array 640. In response to the memory read control signal MR1, the Bus Driver 700 outputs the memory read data MDAT.

When the Memory Block M1 refreshes, the Control Signal Generator 610 disables the 1 decoding control signal CASB1 and enables the 2 decoding control signal RASB1, therefore, the Column Decoder 670 is disabled and the Row Decoder 650 is enabled. In response to the refresh address signal RFA, the Row Decoder controls the Word Line Driver 660 which sequentially enables the word lines W1~W64.

When the Memory Block M1 does a read operation or a write operation, the Control Signal Generator 610 enables the 1 decoding control signal CASB1 and the 2 decoding control signal RASB1, so both the Column Decoder 670 and the Row Decoder 650 are enabled.

While the invention has been shown and described with respect to a preferred embodiment, it should be understood that various changes in form and detail can be made without departing from the sprit and scope of the invention.

We claim:

1. A memory system comprising
   a main memory which must be refreshed to maintain data and which is divided into blocks,
   a cache memory which must be refreshed to maintain data and which stores information corresponding to selected blocks of in said main memory, said cache memory having indicator bits to indicate if particular information is valid information,
   refresh circuitry to periodically refresh said main memory and said cache memory, said refresh circuitry having a refresh start signal,
   input-output circuitry to generate read signals requesting information from a target memory block in said memory system,
   control circuitry operative when said refresh start signal is enabled, a read signal is received, said cache memory is not storing the target block of said read signal, and the data in said cache is not valid data of a different block other than said target block, for (a) delaying the refresh of said target block, (b) reading said requested information from said main memory and transferring the target memory block of said read operation to said cache memory, and after (a) and (b) refreshing said target memory block and said different,
   whereby said read and refresh takes place without a write-back from said cache to said main memory when said cache memory is not storing the target block of said read signal, and the data in said cache is not valid data of a different block other than said target block.

2. The memory system recited in claim 1 wherein said control circuit is operative when said refresh start signal is enabled, a read signal is received, said cache memory is not storing the target block of said read signal, and the data in said cache is valid data of a different block other than said target block, for (a) delaying the refresh of the memory block matching the data in said cache memory and (b) delaying the refresh of said target block, (c) causing the write back of the data in the cache, (d) reading said requested information from said main memory and transferring the target memory block of said read operation to said cache memory, and after (a), (b), (c) and (d) occur, refreshing said target memory block and said different block.

3. The memory system recited in claim 1 wherein said control circuit is operative when said refresh start signal is enabled, a read signal is received, and said cache memory is storing the target block of said read signal, reading the requested data from said cache and refreshing all of said memory blocks.

4. The memory system recited in claim 1 wherein said control circuit is operative when said refresh start signal is disabled, a read signal is received, said cache memory is storing the target block of said read signal, and the data in said cache is valid data of said target block, for reading said requested information from said cache memory.

5. The memory system recited in claim 1 wherein said control circuit is operative when said refresh start signal is disabled, a read signal is received, said cache memory is not storing the target block of said read signal, for reading said requested information from said main memory.

6. The memory system recited in claim 2 wherein said control circuit is operative when said refresh start signal is enabled, a read signal is received, and said cache memory is storing the target block of said read signal, reading the requested data from said cache and refreshing all of said memory blocks.

7. The memory system recited in claim 2 wherein said control circuit is operative when said refresh start signal is disabled, a read signal is received, said cache memory is storing the target block of said read signal, and the data in said cache is valid data of said target block, for reading said requested information from said cache memory.

8. A memory system comprising
   a main memory which must be refreshed to maintain data and which is divided into blocks,
   a cache memory which must be refreshed to maintain data, and which stores selected blocks of information from said main memory, said cache having a valid indicator bit to indicate that the data in said cache is valid data,
   refresh circuitry which is periodically active to refresh said main memory,
   input-output circuitry to write information to a target block in said memory system in response to a write command,
   control circuitry operative when (a) said main memory refresh circuitry is active (b) a write command is received and (c) the data in said cache is data of the target block of said write request, to write said data to said cache, and to refresh said main memory,
   said control circuitry to operative when (a) said main memory refresh circuitry is active (b) a write command is received, and (c) the data in said cache is not data of the memory block to which said write request is directed, to (A) hold the refresh of the target block of the write command and controls the write to the target memory block, (B) refresh the memory blocks other than the target memory block, (C) after the write operation to the target memory block, refreshing the target memory block, (D) if the data in said cache memory is valid data of a memory block other that said target memory block, the data in the cache is written back to said other memory block and the cache is valid bit is disabled.

9. The memory system recited in claim 8 wherein when (a) said main memory refresh circuitry is not active (b) a write command is received (c) the data in said cache is data of the target memory of said write command, said third circuit is adapted to (A) control the write operation to the target memory block, and (B) eliminate the valid bit in said cache.

10. The memory system recited in claim 9 wherein when (a) said main memory refresh circuitry is not active (b) a write command is received (c) the data in said cache is not data from said target memory bloc, said control circuit is adapted to write data to said target memory block.

11. The memory system of claim 1 wherein said main memory and said cache memory comprise DRAM memory elements.

12. The memory system recited in claim 8 wherein said control circuit is operative when (a) said cache memory refresh circuitry is active (b) a write command is received and (c) the data in said cache is valid data of the target memory block of said write request, said first control circuit being adapted to (A) write to said target memory block in said main memory (B) disable the valid bit in said cache, (C) refresh said cache after said write operation.

13. The memory system recited in claim 8 wherein said control circuitry is operative when (a) said cache memory refresh circuitry is active (b) a write command is received (c) the data in said cache is not valid data of the target block of said write operation, said second control circuit being operative to write the data of said write request to the target memory block of said write request.

14. The memory system recited in claim 1 wherein said control circuit is operative when (a) said cache memory refresh circuitry is active (b) a write command is received and (c) the data in said cache is valid data of the target memory block of said write request, said first control circuit being adapted to (A) write to said target memory block in said main memory (B) disable the valid bit in said cache, (C) refresh said cache after said write operation.

15. The memory system recited in claim 1 wherein said control circuit includes means for delaying the refresh of said cache memory when a memory read signal is received when the cache refresh signal is enabled and the data in the cache memory is valid.

16. The memory system recited in claim 8 wherein said controller generally gives priority to read or write operations over refresh operations in said main memory, and generally gives priority to the refresh operations over read or write operations in said cache memory, however, said controller delays the refresh of said cache memory when a memory read command is received, said cache refresh signal is enabled and the data in the cache memory is valid.

17. A method of operating a memory system that includes, a main memory which must be refreshed in order to retain data,
a cache memory which must be refreshed in order to retain data,
said method including the steps of:
periodically refreshing said main memory and said cache memory in response to main memory refresh and cache memory refresh commands,
said memory system from time to time receiving memory write commands for initiating memory storage operations and receiving memory read commands for initiating data retrieval operations
generally giving priority to read or write operations over refresh operations in said main memory, and generally giving priority to the refresh operations over read or write operations in said cache memory,
delaying the refresh of said cache memory when a memory read command is received, said cache refresh signal is enabled and the data in the cache memory is valid.

18. A method of operating a memory system recited in claim 17 wherein when a read command is received and said main memory refresh command is active, and the memory block that is the target of said read command is not in said cache, and the data in said cache is valid data of another memory block, writing back from said cache to said main memory said other memory block, reading said requested data from said main memory, and storing the target of said read operation in said cache memory, and then refreshing said target block and said other memory block.

19. A method of operating a memory system recited in claim 17 wherein when a read command is received and said main memory refresh command is active, and the memory block that is the target of said read command is not in said cache, and the data in said cache is not valid data of another memory block, reading said requested data from said main memory, storing the target of said read operation in said cache memory, and then refreshing said target block and said other memory block, there being no write back operation from said cache to said main memory whereby the number of write back operations is minimized.

20. A method of operating a memory system recited in claim 17 wherein:
(A) when a read command is received and said main memory refresh command is active, and the memory block that is the target of said read command is not in said cache, and the data in said cache is valid data of another memory block, writing back from said cache to said main memory said other memory block, reading said requested data from said main memory, and storing the target of said read operation in said cache memory, and then refreshing said target block and said other memory block, and
(B) when a read command is received and said main memory refresh command is active, and the memory block that is the target of said read command is not in said cache, and the data in said cache is not valid data of another memory block, reading said requested data from said main memory, storing the target of said read operation in said cache memory, and then refreshing said target block and said other memory block,
there being no write back operation in (B) whereby the number of write back operations is minimized.

* * * * *

UNITED STATES PATENT AND TRADEMARK OFFICE
CERTIFICATE OF CORRECTION

PATENT NO. : 7,187,608 B2
APPLICATION NO. : 11/193805
DATED : March 6, 2007
INVENTOR(S) : Min-Yeol Ha et al.

It is certified that error appears in the above-identified patent and that said Letters Patent is hereby corrected as shown below:

Column 4, line 43, the words "961 and 961." should read -- 961. --;
Column 5, line 11, the word "9698" should read -- 968 --.

Signed and Sealed this

Thirtieth Day of September, 2008

JON W. DUDAS
*Director of the United States Patent and Trademark Office*